United States Patent
Tsai et al.

(10) Patent No.: US 11,302,582 B2
(45) Date of Patent: Apr. 12, 2022

(54) PRE-DEPOSITION TREATMENT FOR FET TECHNOLOGY AND DEVICES FORMED THEREBY

(71) Applicant: Taiwan Semiconductor Manufacturing Co., Ltd., Hsinchu (TW)

(72) Inventors: Cheng-Yen Tsai, New Taipei (TW); Chung-Chiang Wu, Taichung (TW); Tai-Wei Hwang, Kinmen (TW); Hung-Chin Chung, Pingzhen (TW); Wei-Chin Lee, Taipei (TW); Da-Yuan Lee, Jhubei (TW); Ching-Hwanq Su, Tainan (TW); Yin-Chuan Chuang, Yunlin (TW); Kuan-Ting Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 225 days.

(21) Appl. No.: 16/686,388

(22) Filed: Nov. 18, 2019

(65) Prior Publication Data

US 2020/0083108 A1    Mar. 12, 2020

Related U.S. Application Data

(62) Division of application No. 15/992,556, filed on May 30, 2018, now Pat. No. 10,504,789.

(51) Int. Cl.
*H01L 21/8234* (2006.01)
*H01L 27/088* (2006.01)
(Continued)

(52) U.S. Cl.
CPC ........ *H01L 21/823462* (2013.01); *H01L 21/02178* (2013.01); *H01L 21/02205* (2013.01); *H01L 27/0886* (2013.01); *H01L 29/513* (2013.01)

(58) Field of Classification Search
CPC ........ H01L 21/823462; H01L 27/0886; H01L 21/02205; H01L 21/02178; H01L 29/513;
(Continued)

(56) References Cited

U.S. PATENT DOCUMENTS

2009/0206418 A1    8/2009    Ramaswamy et al.
2013/0334690 A1    12/2013   Tsai et al.
(Continued)

FOREIGN PATENT DOCUMENTS

CN        107958872 A        4/2018

*Primary Examiner* — Julia Slutsker
(74) *Attorney, Agent, or Firm* — Slater Matsil, LLP

(57) ABSTRACT

Embodiments disclosed herein relate to a pre-deposition treatment of materials utilized in metal gates of different transistors on a semiconductor substrate. In an embodiment, a method includes exposing a first metal-containing layer of a first device and a second metal-containing layer of a second device to a reactant to form respective monolayers on the first and second metal-containing layers. The first and second devices are on a substrate. The first device includes a first gate structure including the first metal-containing layer. The second device includes a second gate structure including the second metal-containing layer different from the second metal-containing layer. The monolayers on the first and second metal-containing layers are exposed to an oxidant to provide a hydroxyl group (—OH) terminated surface for the monolayers. Thereafter, a third metal-containing layer is formed on the —OH terminated surfaces of the monolayers on the first and second metal-containing layers.

20 Claims, 18 Drawing Sheets

(51) Int. Cl.
*H01L 21/02* (2006.01)
*H01L 29/51* (2006.01)

(58) Field of Classification Search
CPC ............. H01L 21/321; H01L 21/82345; H01L 29/165; H01L 29/4966; H01L 21/823431; H01L 29/66545; H01L 29/401; H01L 29/42356

See application file for complete search history.

(56) References Cited

U.S. PATENT DOCUMENTS

| | | | |
|---|---|---|---|
| 2016/0181163 A1 | 6/2016 | Huang et al. | |
| 2017/0309520 A1* | 10/2017 | Liou | H01L 29/517 |
| 2018/0040620 A1* | 2/2018 | Ha | H01L 29/7854 |
| 2018/0166274 A1* | 6/2018 | Lin | H01L 21/02244 |
| 2019/0088556 A1 | 3/2019 | Huang et al. | |

\* cited by examiner

PRE-DEPOSITION TREATMENT FOR FET TECHNOLOGY AND DEVICES FORMED THEREBY

PRIORITY CLAIM AND CROSS-REFERENCE

This application is a divisional of U.S. application Ser. No. 15/992,556, filed on May 30, 2018, now U.S. Pat. No. 10,504,789, which is hereby incorporated herein by reference

BACKGROUND

When fabricating field effect transistors (FETs), such as fin-like FETs (FinFETs), device performance can be improved by using a metal gate electrode instead of a polysilicon gate electrode. Formation of the metal gate electrode may include sequentially forming a gate dielectric layer, a barrier layer, a work function layer, and a metal liner layer in a high aspect ratio trench, followed by the trench filling with a gate material. The work function layer may use different materials for different types of transistors, such as p-type FinFET or n-type FinFET, to fine tune threshold voltage (Vt) of the transistor and thus enhance device electrical performance as needed. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
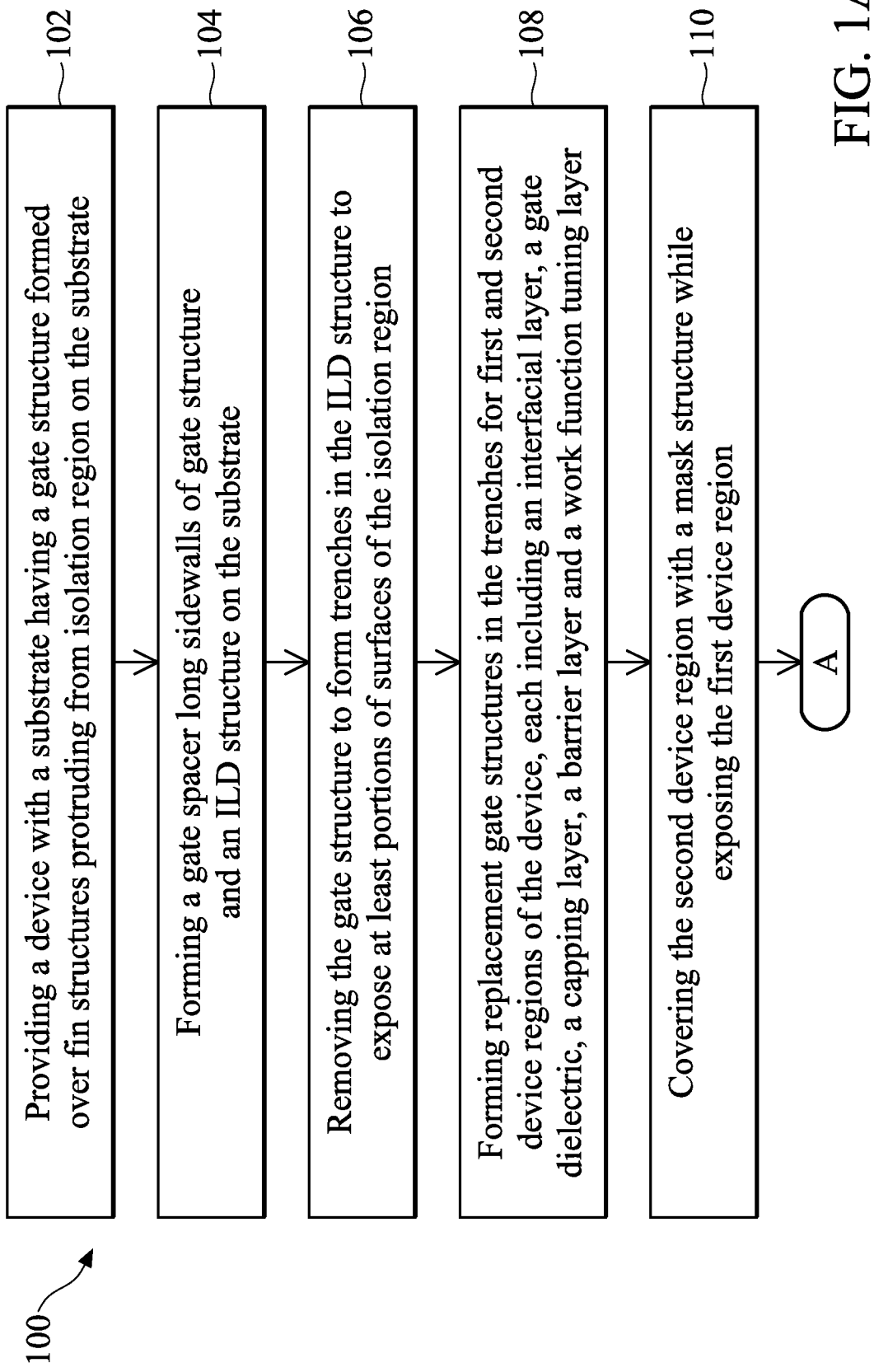
FIGS. 1A and 1B illustrate a flow chart illustrating an exemplary method for fabricating a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to a pre-treatment of work function materials utilized in metal gates of different types of transistors on a same semiconductor substrate. Generally, the pre-treatment passivates a surface of the work function materials with a monolayer, such as a monolayer of aluminum oxide or silicon oxide. The pre-treatment may ensure the layer subsequently deposited on the passivated surface of the work function materials will have a more uniform thickness in the metal gates of different types of transistors, allowing minimized impacts on the gap-filling performance and/or threshold voltage (Vt) of other layers in the metal gate. Other embodiments include methods of multi-Vt tuning for n-type or p-type devices by providing different or distinct metal layer between a work-function tuning layer and a gate dielectric layer for different device regions of a FET, such as an n-FET or p-FET device. The distinct metal layer can affect the composition and thickness of the work-function tuning layer, thereby changing the work function value of the work-function tuning layer deposited thereon. The distinguished work-function tuning layers on different substrates provide different n-type work functions for the purpose of multi-Vt tuning without stacking multilayers of the metal layer. As a result, more space can be provided for metal gate filling.

The foregoing broadly outlines some aspects of embodiments described in this disclosure. It is contemplated that the pre-treatment process may be implemented for a planar transistor device or for a three-dimensional transistor device, such as the semiconductor device 201 described in this disclosure. Some example devices for which aspects described herein may be implemented include fin field effect transistors (FinFETs), Horizontal Gate All Around (HGAA) FETs, Vertical Gate All Around (VGAA) FETs, nanowire channel FETs, strained-semiconductor devices, silicon-on-insulator (SOI) devices, or other devices that can be beneficial from the pre-treatment process to mitigate the issues associated with loading effect and/or substrate-dependent growth.

Figure 1B:
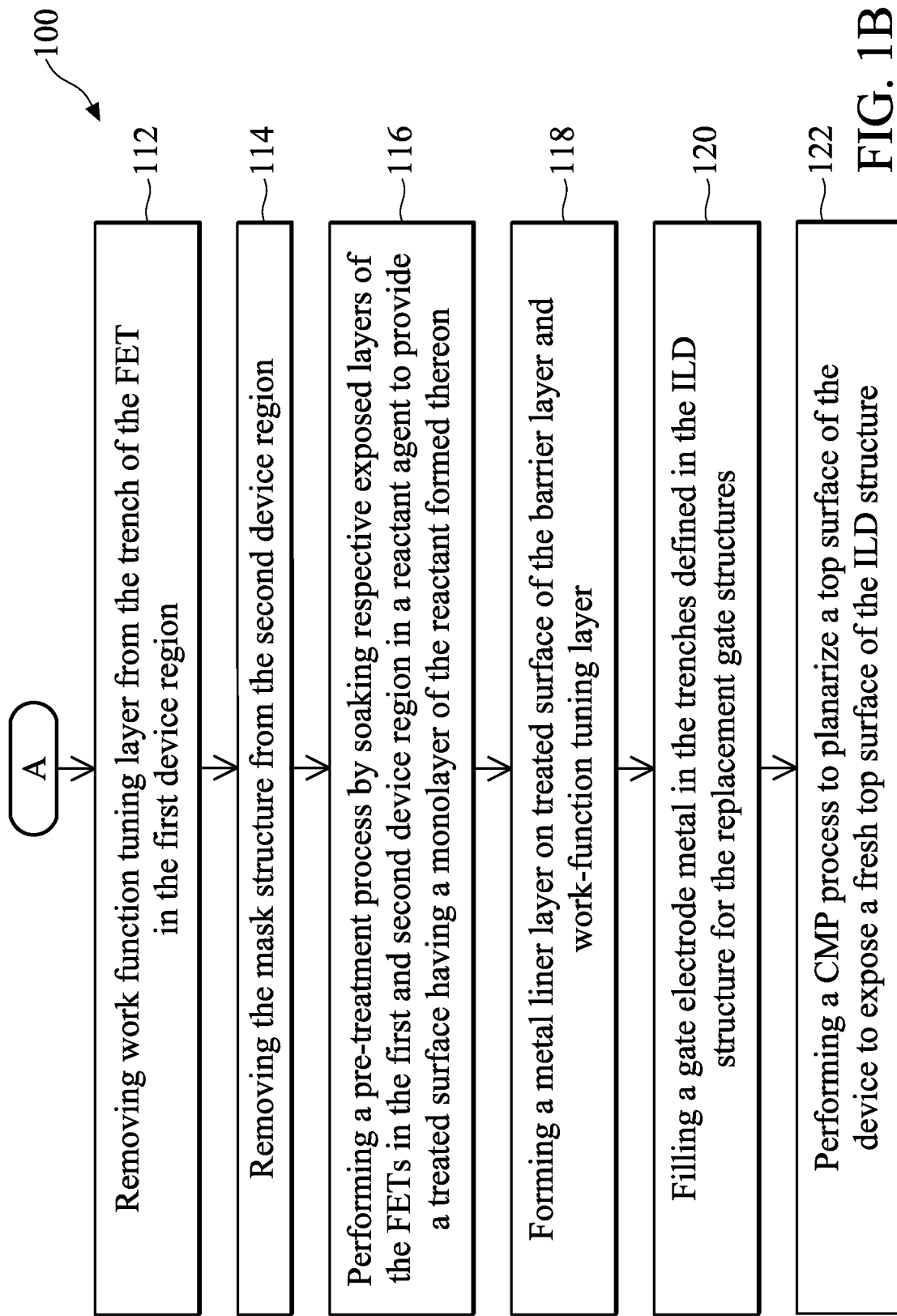
Figure 2:
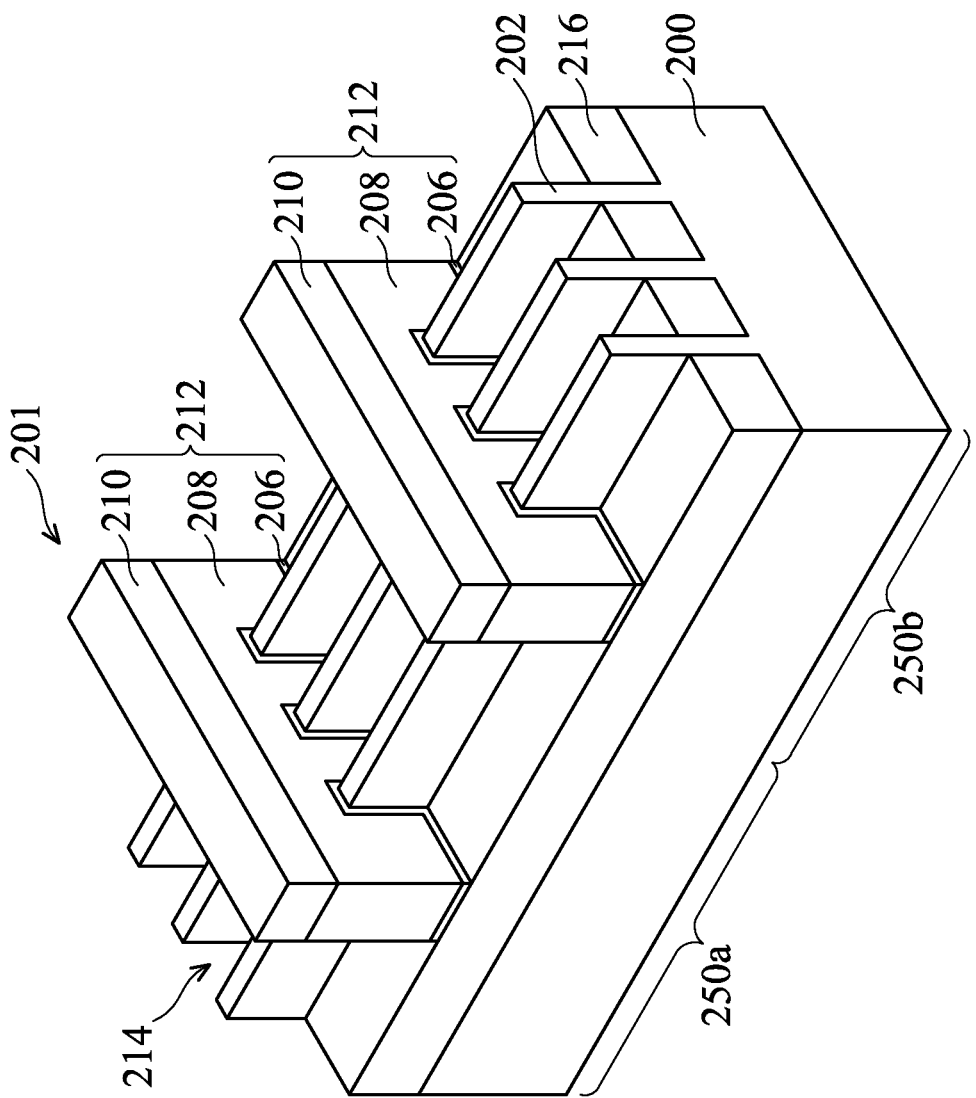
FIGS. 2 through 4 are perspective views of a portion of the semiconductor device corresponding to various stages of fabrication according to some embodiments.
Figure 3:
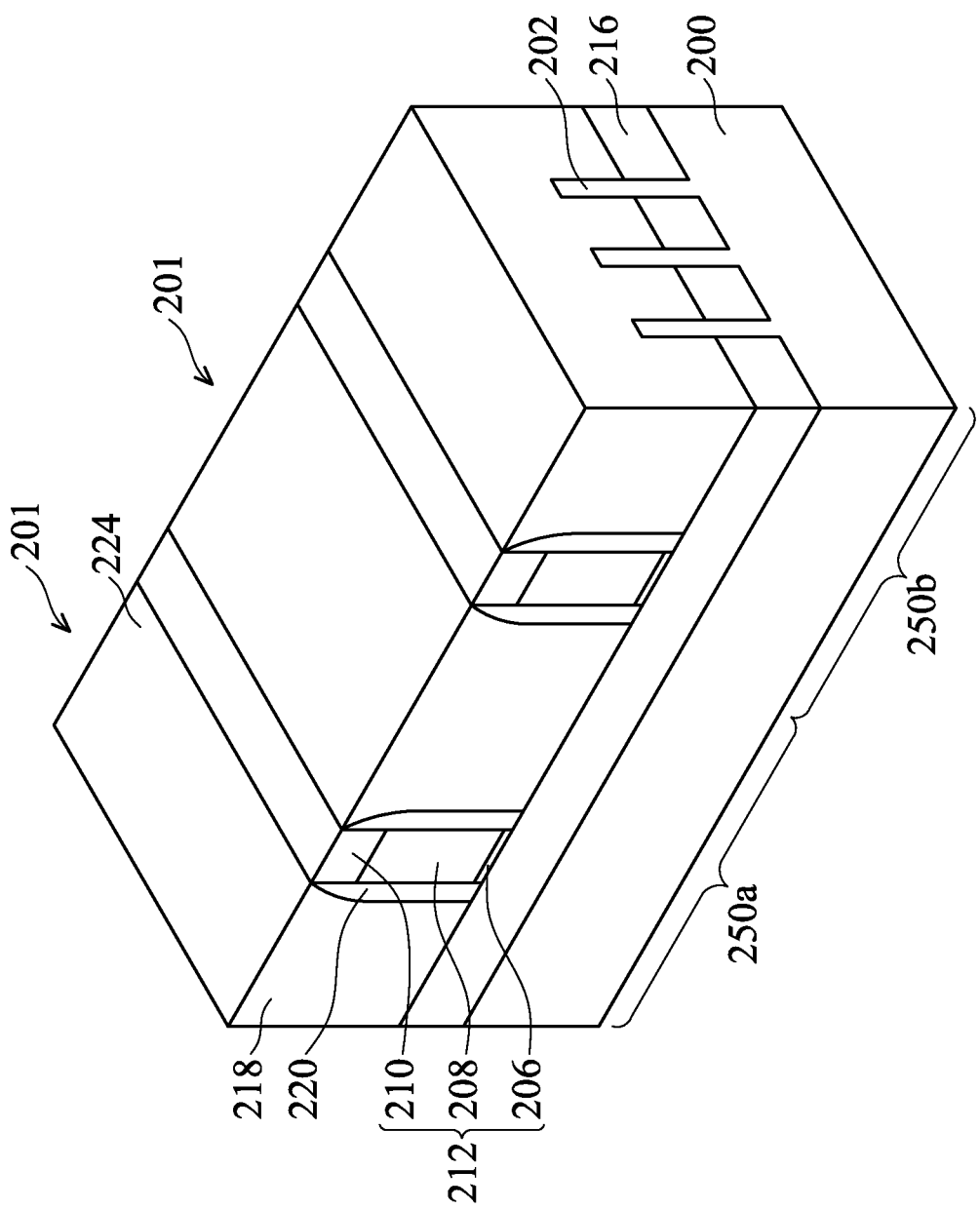
Figure 4:
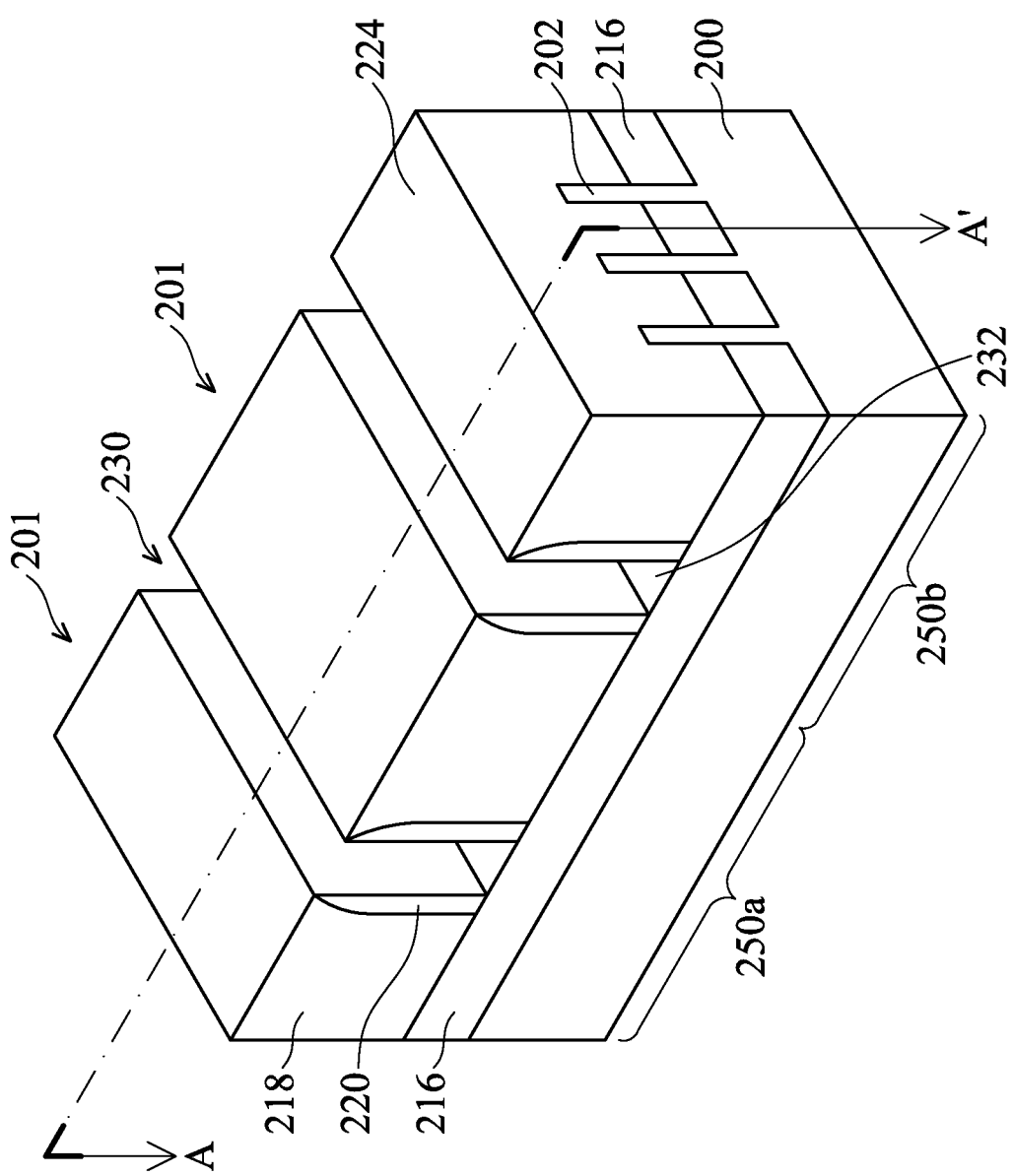

FIGS. 1A and 1B illustrate a flow chart 100 illustrating an exemplary method for fabricating a semiconductor device 201 according to various embodiments of the present disclosure. FIGS. 2 through 4 are perspective views and FIGS. 5 through 11 are schematic cross-sectional views of a portion of the semiconductor device corresponding to various stages of fabrication according to the flow chart of FIGS. 1A and 1B. It is noted that the flow chart 100 may be utilized to form any other semiconductor structures not presented herein. Those skilled in the art should recognize that the full process for forming a semiconductor device and the associated structures are not illustrated in the drawings or described herein. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially if not entirely.

The flow chart 100 begins at operation 102 by providing a substrate 200 having a gate structure 212 formed over a plurality of fins 202 formed on the substrate 200, as shown in FIG. 2. The substrate 200 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate may include an elemental semiconductor including silicon (Si) or germanium (Ge); a compound semiconductor; an alloy semiconductor; or a combination thereof. Other substrates may be used.

Each fin 202 provides an active region where one or more devices are formed. The fins 202 are fabricated using suitable processes performed on the substrate 200 including masking, photolithography, and/or etch processes, to form trenches 214 into the substrate 200, leaving the fins, such as the fins 202, extended upwardly from the substrate 200. The fins 202 may be patterned by any suitable method. For example, the fins 202 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 202 and form the trenches 214.

The trenches 214 may then be filled with an insulating material such as an oxide (e.g., silicon oxide), a nitride, the like, or a combination thereof by an appropriate deposition technique. Other insulating materials formed by any acceptable process may be used. The insulating material may be recessed, such as by using an acceptable etch process, to form the isolation regions 216. The insulating material is recessed such that the fins 202 protrude above and from between neighboring isolation regions 216.

The isolation regions 216 can separate the semiconductor device 201 into various device regions. In the example as shown, the semiconductor device 201 includes a first device region 250a and a second device region 250b. One or more devices may be formed in the first device region 250a, and one or more devices may be formed in the second device region 250b. For example, each of the device regions 250a, 250b may include a type of devices, such as p-type devices or n-type devices, and further, the characteristics of devices may vary within each of the device regions 250a, 250b. In some embodiments, the semiconductor device 201 may be a multi-threshold voltage IC device utilized to optimize delay or power, for example. In such a case, the devices in the device regions 250a, 250b may be any combination of an n-type ultra-low threshold voltage (N-uLVT) device, an n-type low threshold voltage (N-LVT) device, an n-type standard threshold voltage (N-SVT), an n-type high threshold voltage (N-HVT) device, a p-type ultra-low threshold voltage (P-uLVT) device, a p-type low threshold voltage (P-LVT) device, a p-type standard threshold voltage (P-SVT), a p-type high threshold voltage (P-HVT) device, or any combination thereof. For example, an n-type device, such as an n-type FinFET device, can be in the first device region 250a, and may be an N-SVT device, while another n-type device can be in the second device region 250b and may be an N-uLVT device. However, it is contemplated that a person having ordinary skill in the art may employ in the device regions any type of devices, and further, may employ any number of metal gates, each including any of a variety of different types of work-function tuning layer (to be described below) and/or combination of layers to achieve a desired multiple threshold voltage scheme.

Dummy gate structures 212 are then formed over the fins 202. The dummy gate structures 212 each includes an interfacial dielectric 206, a dummy gate 208, and a mask 210. The interfacial dielectric 206, dummy gate 208, and mask 210 for the dummy gate structures 212 may be formed by sequentially forming respective layers, and then patterning those layers into the dummy gate structures 212. For example, a layer for the interfacial dielectrics 206 may include or be silicon oxide, silicon nitride, the like, or multilayers thereof, and may be thermally and/or chemically grown on the fins 202, or conformally deposited, such as by plasma enhanced chemical vapor deposition (PECVD), atomic layer deposition (ALD), or any suitable deposition technique. A layer for the dummy gates 208 may include or be silicon (e.g., polysilicon) or another material deposited by chemical vapor deposition (CVD), physical vapor deposition (PVD), or any suitable deposition technique. A layer for the mask 210 may include or be silicon nitride, silicon oxynitride, silicon carbon nitride, the like, or a combination thereof, deposited by CVD, PVD, ALD, or any suitable deposition technique. The layers for the mask 210, dummy gates 208, and interfacial dielectrics 206 may then be patterned, for example, using photolithography and one or more etch processes, to form the mask 210, dummy gate 208, and interfacial dielectric 206 for each dummy gate structure 212.

At operation 104, gate spacers 220 are formed along sidewalls of the gate structure 212 (e.g., sidewalls of the interfacial dielectrics 206, dummy gates 208, and masks 210) and over the fins 202. The gate spacers 220 may be formed by conformally depositing one or more layers for the gate spacers 220 and anisotropically etching the one or more layers, for example. The one or more layers for the gate spacers 220 may include a material different from the material(s) for the gate structure 212. In one embodiment, the gate spacer 220 may include or be a dielectric material, such as silicon oxygen carbide, silicon nitride, silicon oxynitride, silicon carbon nitride, the like, multi-layers thereof, or a combination thereof, and may be deposited by CVD, ALD, or any suitable deposition technique. An anisotropic etching process, such as a RIE, NBE, or any suitable etch process, is then performed to remove portions of the spacer layers to form the gate spacer 220, as depicted in FIG. 3.

After the gate spacer 220 is formed, source/drain regions 213a, 213b may be formed in the fins 202. In some examples, recesses can be etched in the fins 202 using the dummy gate structures 212 as masks (such that recesses are formed on opposing sides of the dummy gate structures 212), and an epitaxial material may be epitaxially grown in the recesses to form the source/drain regions 213a, 213b. Additionally or alternatively, the source/drain regions 213a, 213b may be formed by implanting dopants into the fins 202 and/or the epitaxial source/drain regions using the dummy gate structures 212 as masks (such that the source/drain regions are formed on opposing sides of the dummy gate structures 212).

Subsequently, an interlayer dielectric (ILD) 218 is formed over the substrate 200 and on the gate spacer 220. In some embodiments, the semiconductor device 201 may further include a contact etch stop layer (not shown) underneath the ILD 218 and above the substrate 200 and gate spacer 220. The contact etch stop layer may include or be silicon nitride, silicon carbon nitride, silicon carbon oxide, carbon nitride, the like, or a combination thereof, and may be deposited by CVD, PECVD, ALD, or any suitable deposition technique. The ILD 218 may include or be tetraethylorthosilicate (TEOS) oxide, silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The ILD 218 may be deposited by spin-on, CVD, FCVD, PECVD, PVD, or any suitable deposition technique. A chemical mechanical planarization (CMP) process may then be performed to planarize the ILD 218 and to remove the masks 210 of the dummy gate structures 212, thereby defining a top surface 224 that is substantially coplanar with a top surface of the dummy gates 208 of the gate structures 212, as shown in FIG. 3.

At operation 106, the gate structures 212 are removed using one or more etch processes. Upon removal of the gate structures 212, trenches 230 are formed to expose at least portions of surfaces 232 of the isolation regions 216, as shown in FIG. 4, and surfaces of channels of the fins 202. The trench 230 allows a gate structure, such as a replacement gate structure, to be formed therein. In some examples, the dummy gates 208 exposed through the top surface 224 of the ILD 218 are removed using an etching process, and the interfacial dielectrics 206 are thereafter removed by a different etching process. The etching processes may include a suitable wet etch, dry (plasma) etch, and/or other suitable processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof. Trenches 230 are therefore formed between the gate spacers 220 where the gate structures 212 are removed, and channel regions of the fins 202 are exposed through the trenches 230.

FIGS. 5 through 11 depict cross-sectional views of the semiconductor device at further manufacturing stages. The cross-sectional views of FIGS. 5 through 11 correspond to the cross-section A-A' in FIG. 4. The cross-section A-A' is along the fins 202 and is generally orthogonal to a longitudinal direction of the trenches 230.

Figure 5:
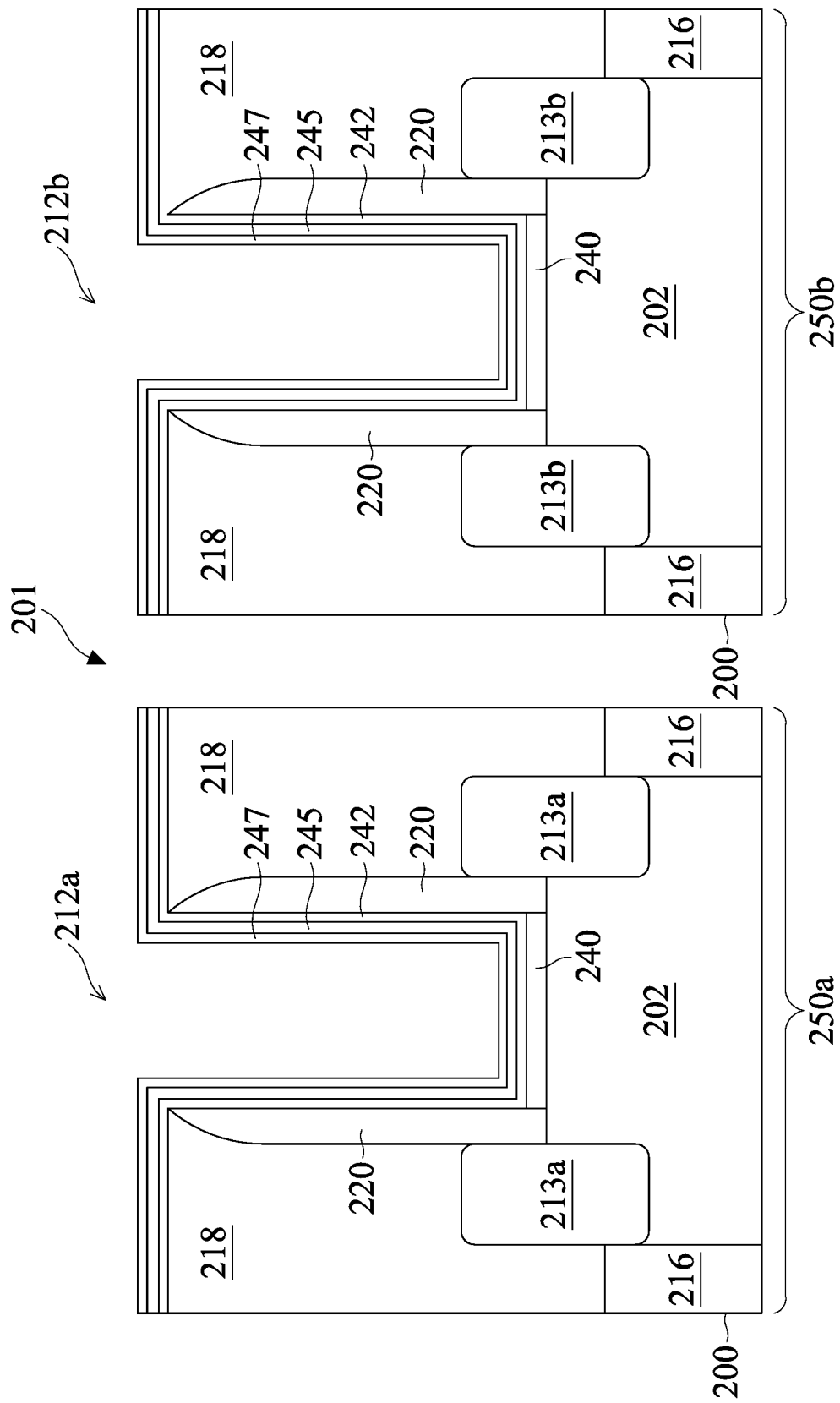
FIGS. 5 through 11 are schematic cross-sectional views of a portion of the semiconductor device corresponding to various stages of fabrication according some embodiments.

At operation 108, layers for replacement gate structures 212a, 212b for the first and second device regions 250a, 250b, respectively, are formed in the trenches 230 where the dummy gate structures 212 were removed. In the illustrated embodiment, the layers for the replacement gate structures 212a, 212b include an interfacial dielectric 240, a gate dielectric layer 242, a capping layer 245, and an optional barrier layer 247 sequentially formed in the trenches 230 between the gate spacers 220 in the first and second device region 250a, 250b, respectively, as shown in FIG. 5. The interfacial dielectrics 240 are formed on top and sidewalls surfaces of the fins 202 along the channel regions (defined under the replacement gate structures and between the source/drain regions). The interfacial dielectric 240 can be, for example, an oxide (e.g., silicon oxide) formed by thermal or chemical oxidation of the fins 202, a nitride (e.g., silicon nitride), and/or any suitable dielectric layer formed by CVD, ALD, molecular beam deposition (MBD), or any suitable deposition technique.

The gate dielectric layer 242 can be conformally deposited in the trenches 230 on the interfacial dielectric 240, sidewalls of the gate spacers 220 and on the top surfaces of the ILD 218 and the contact etch stop layer (if used). The gate dielectric layer 242 may include or be silicon oxide, silicon nitride, a high-k dielectric material, multilayers thereof, or other suitable dielectric material. A high-k dielectric material may have a k value greater than about 4.0, for example about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 242 can be deposited by ALD, PECVD, MBD, or any suitable deposition technique.

Then, the capping layer 245 and the barrier layer 247 can be conformally (and sequentially) deposited on the gate dielectric layer 242. The capping layer 245 and the barrier layer 247 can include a nitride, silicon nitride, carbon nitride, and/or aluminum nitride of tantalum and/or titanium; a nitride, carbon nitride, and/or carbide of tungsten; the like; or a combination thereof; and may be deposited by ALD, PECVD, MBD, or another deposition technique. In some examples, a capping layer 245 (e.g., a TiN layer) is formed conformally on the gate dielectric layer 242; a barrier layer 247 (e.g., a TaN layer) is formed conformally on the capping layer 245. In some cases, the barrier layer 247 may also be or part of a work-function tuning layer. In some examples, the barrier layer 247 can be omitted. While the capping layer 245 and barrier layer 247 are each shown as a single layer, it is contemplated that one or more barrier layers and/or capping layers is also possible and can be implemented in any desired order depending upon the application and threshold voltage needed for the device.

After the gate dielectric layer 242, the capping layer 245, and the barrier layer 247 are formed, a work-function tuning layer 244 is conformally formed on the barrier layer 247. The work-function tuning layer 244 may be or include a single layer of a material or multiple layers each being a different material. While a single layer of the work-function tuning layer 244 is shown, it is contemplated that the work-function tuning layer 244 may include one or more work function materials, depending on the application and threshold voltage needed for the device. In the embodiment shown in FIG. 6, the work-function tuning layer 244 is a work function material formed in both first and second device regions 250a, 250b.

A work function value is associated with the material composition of the work-function tuning layer 244. The material of the work-function tuning layer 244 is chosen to tune its work function value so that a desired threshold voltage (Vt) is achieved in the device that is to be formed in the respective region. Suitable examples of the work function material for a p-type device may include TiAlN, TiN, TaN, Ru, Mo, WN, $ZrSi_2$, $MoSi_2$, $TaSi_2$, $NiSi_2$, WCN, other suitable materials having a work function ranging between 4.8 eV and 5.2 eV, or any combination thereof, and suitable examples of the work function material for an n-type device may include Ti, Al, TaAl, TaAlC, TiAlC, TiAlO, HfAl, TiAl, TaC, TaCN, TaSiN, Mn, Zr, other suitable materials having a work function ranging between 3.9 eV and 4.3 eV, or any combination thereof. In some embodiments, the work-function tuning layer 244 for p-FETs includes respective layers of TiAlN and TiN, while the work-function tuning layer 244 for n-FETs includes respective layers of TiAlC and TiAlO. In some cases, the work-function tuning layer 244 for the n-FETs includes respective layers of TiAlC and TiN. Any of materials described here can be deposited in any desired sequence.

The work-function tuning layer 244 may be deposited by ALD, CVD, PECVD, MBD, and/or any other suitable process. In an example depicted herein, the work-function tuning layer 244 is formed using an ALD process at a temperature from about 200° C. to 600° C. The thickness of the work-function tuning layer 244 may be altered and adjusted by altering process parameters during the ALD deposition process, such as the number of deposition cycles, number of the pulses of precursors, pulse frequency, substrate temperature, pressure, and the like. It is contemplated that multiple depositions of various work-function tuning layers, patterning and etching may be performed to obtain a multiple threshold voltage scheme.

Figure 6:
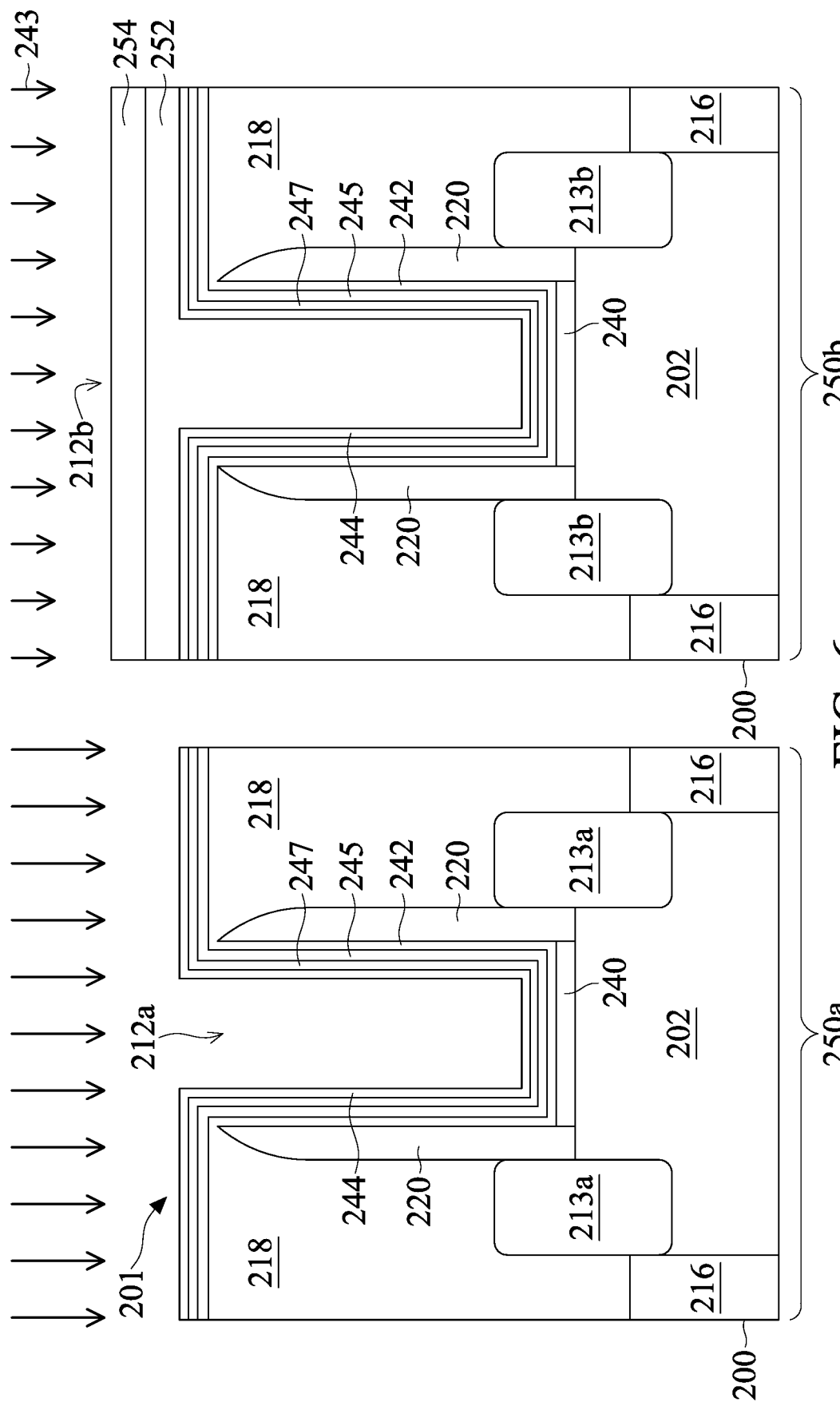

At operation 110, a patterned mask structure 248 is disposed on the second device region 250b of the semiconductor device 201 of the substrate 200, as shown in FIG. 6. The patterned mask structure 248 overfills the trench 230 and covers the exposed surface of the second device region 250b. The patterned mask structure 248 protects the FET in the second device region 250b from damage during the etching/patterning process, while exposing the first device region 250a of the semiconductor device 201 for further processing such as etching. In some embodiments, the patterned mask structure 248 may include a photoresist 254 patterned with a photolithography process and may further include a bottom anti-reflective coating (BARC) 252 filling the trenches 230 in the device regions 250b.

At operation 112, an etching process 243 is performed to remove the work-function tuning layer 244 from the trench 230 of the FET in the first device region 250a that is not covered by the patterned mask structure 248, as shown in FIG. 6. Upon removal of the work-function tuning layer 244, the barrier layer 247 in the trench 230 of the FET in the first device region 250a is exposed. The etching process may be a wet etching process performed by immersing or soaking the substrate 200 with an etching solution. Alternatively or additionally, a dry process, such as a vapor or a plasma process, may be utilized to remove the work-function tuning layer 244 in the first device region 250a. In some embodiments, a combination of wet and dry processes may be utilized to remove the work-function tuning layer 244 from the desired locations. In some examples, the work-function tuning layer 244 is removed from the trench 230 using a wet process performed such as dipping, immersing, or soaking the substrate with or in an etching solution in a wet tank. In such a case, the etching solution may be an alkaline, neutral or acid solution with a pH value in a predetermined range, depending on the material types of the work-function tuning layer 244 to be removed.

Although the work-function tuning layer 244 is illustrated as one layer, the work-function tuning layer 244 may include multiple layers of different materials, as described above. Hence, in some examples, it is contemplated that one or more of the multiple layers of the work-function tuning layer 244 are removed by the etching process 243, while one or more of the multiple layers of the work-function tuning layer 244 remain after the etching process 243.

Figure 7:
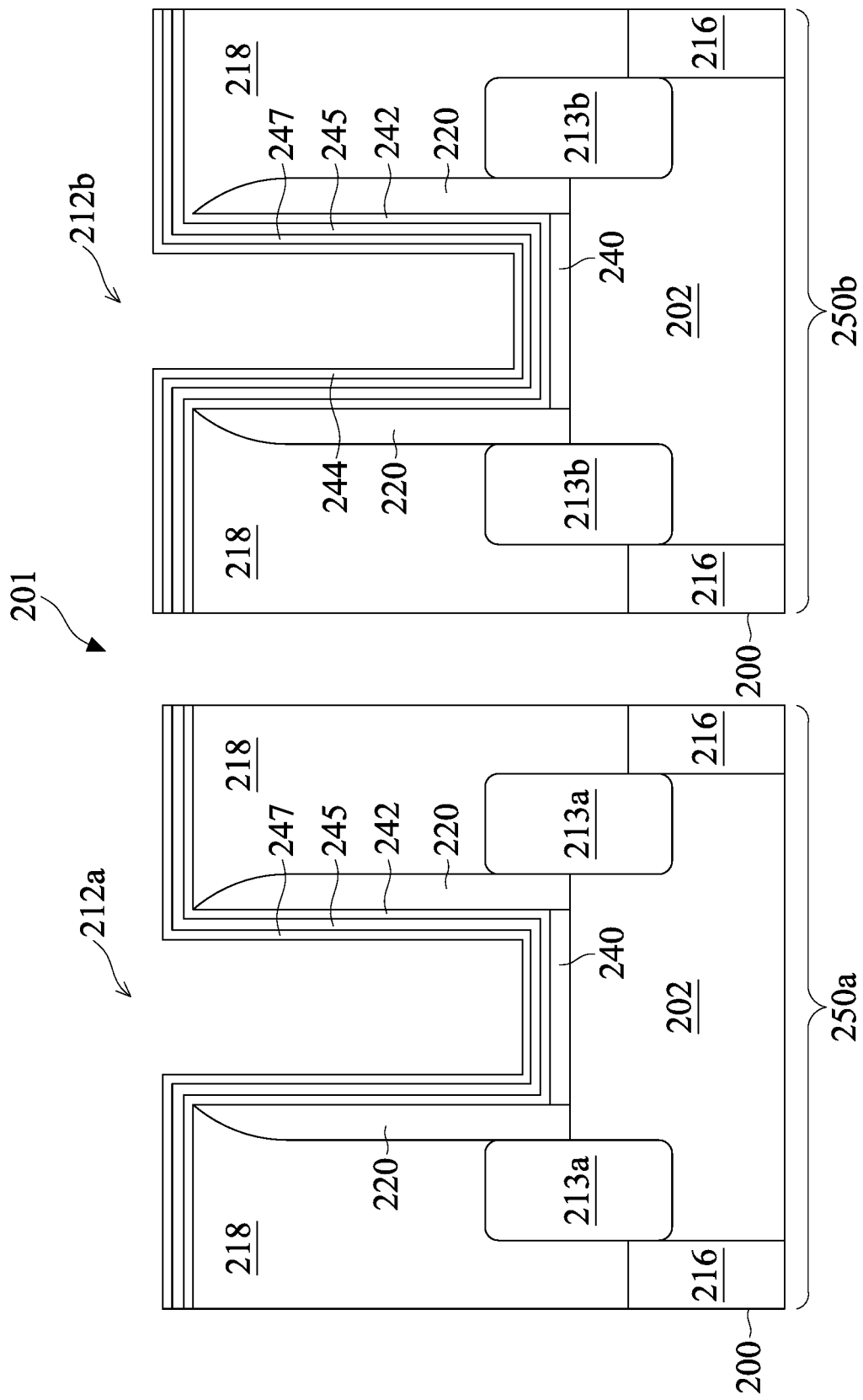

At operation 114, after the work-function tuning layer 244 has been removed from the trench 230 of the FET in the first device region 250a, the patterned mask structure 248 is removed from the second device region 250b, as shown in FIG. 7. The patterned mask structure 248 may be removed using any suitable process such as resist stripping or ashing.

FIG. 7 shows the semiconductor device 201 at an intermediate stage of processing in which the barrier layer 247 in the trench 230 of the FET in the first device region 250a and the work-function tuning layer 244 in the trench 230 of the FET in the second device region 250b are exposed. In other examples, as indicated previously, a layer of the work-function tuning layer 244 in the trench 230 of the FET in the first device region 250a and another layer of the work-function tuning layer 244 in the trench 230 of the FET in the second device region 250b are exposed, which layers in the different device regions 250a, 250b may be a different material. Although subsequent description in FIGS. 8 through 11 may refer to the barrier layer 247 in the trench 230 of the FET in the first device region 250a and the work-function tuning layer 244 in the trench 230 of the FET in the second device region 250b, a person having ordinary skill in the art will readily understand that such description is applicable to different layers of the work-function tuning layer 244 (e.g., with the different layers being different materials) being in the different device regions 250a, 250b.

The surface of the barrier layer 247 and/or the surface of the work-function tuning layer 244 may oxidize due to exposure to an external ambient after deposition of the work-function tuning layer. For example, the semiconductor device may have been transferred ex-situ to another processing chamber (e.g., an etch process chamber) of the processing system for processing (e.g., for removing the work-function tuning layer). Oxidation of the barrier layer 247 and the work-function tuning layer 244, which may contain transition metals (e.g., Ta, Ti, etc.), tend to have hydrogen (—H) terminated surfaces after exposure to an external ambient such as air. However, the barrier layer and the work-function tuning layer 244 having hydrogen terminated surfaces are generally less reactive to the subsequent ALD metal liner layer deposition as compared to hydroxyl group (—OH) terminated surfaces, which in turn can affect the growth rate of the subsequent ALD metal liner layer.

Various embodiments include an in-situ pre-treatment or pre-deposition treatment process which includes soaking a barrier layer and/or a work-function tuning layer in a reactant agent to provide a treated surface for the barrier layer and/or the work-function tuning layer prior to deposition of a metal liner layer by an ALD. The treated surface has a monolayer of the reactant formed thereon. The monolayer of the reactant is oxidized when exposing to an external ambient such as air or oxidants, leaving the monolayer of the reactant terminated with hydroxyl group (—OH) that can readily react with the subsequent ALD used to form a metal liner layer. By employing the present pre-treatment process, the work function of the subsequently deposited metal liner layer may not depend on the quality of an underlying surface (e.g., such as an underlying work-function tuning layer having an oxidized surface layer). In addition, the growth rate of the subsequently deposited metal liner layer may not depend on a varying substrate surface (e.g., of the barrier layer or work-function tuning layer) that can affect the growth rate (and thus the thickness) of the subsequently deposited metal liner layer. The pre-treated barrier layer and/or the work-function tuning layer provide the same treated starting surface for the subsequent ALD of the metal liner layer. As a result, the loading effect for the subsequent ALD due to substrate dependent growth is mitigated.

Figure 8A:
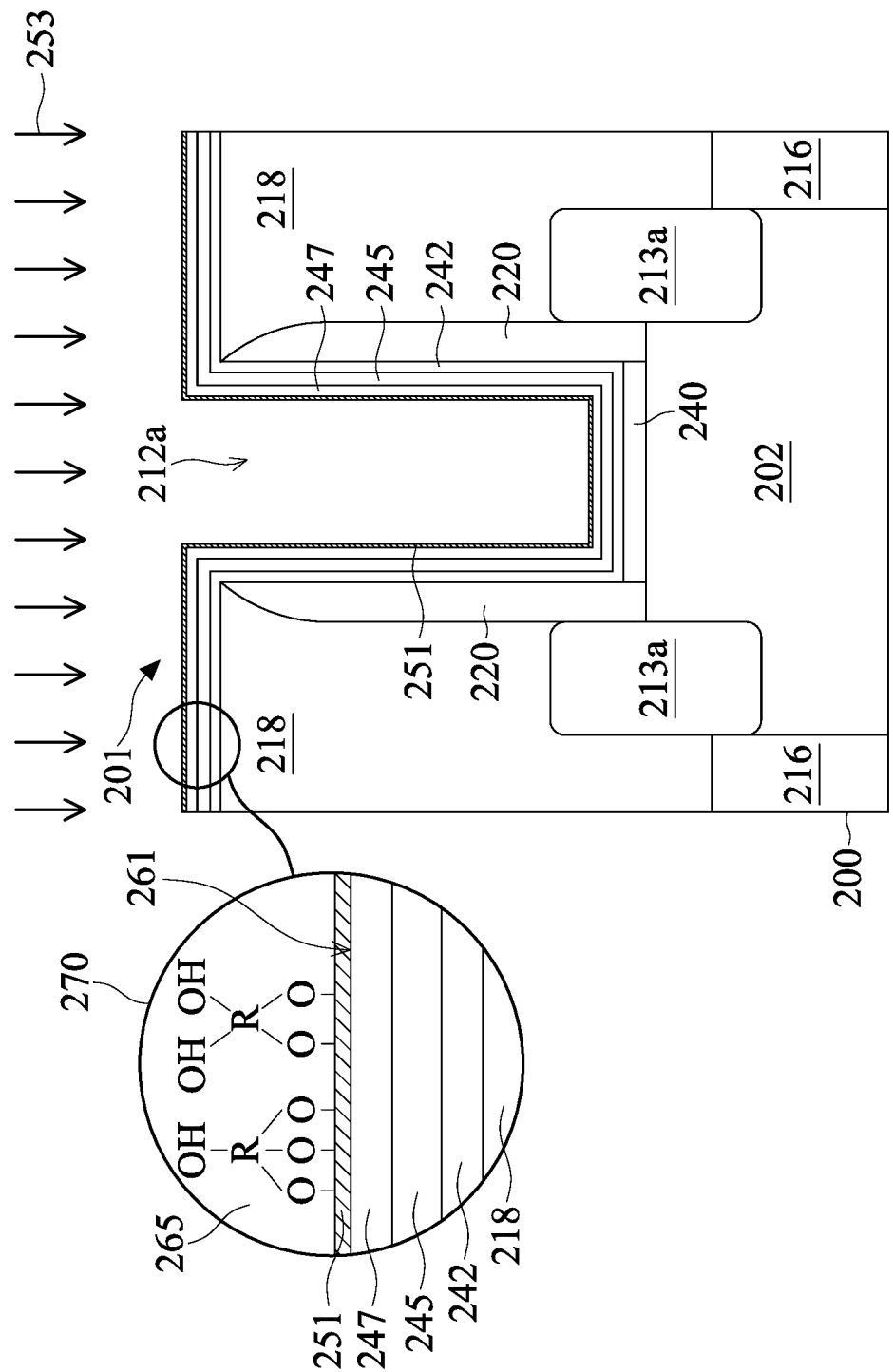
Figure 8B:
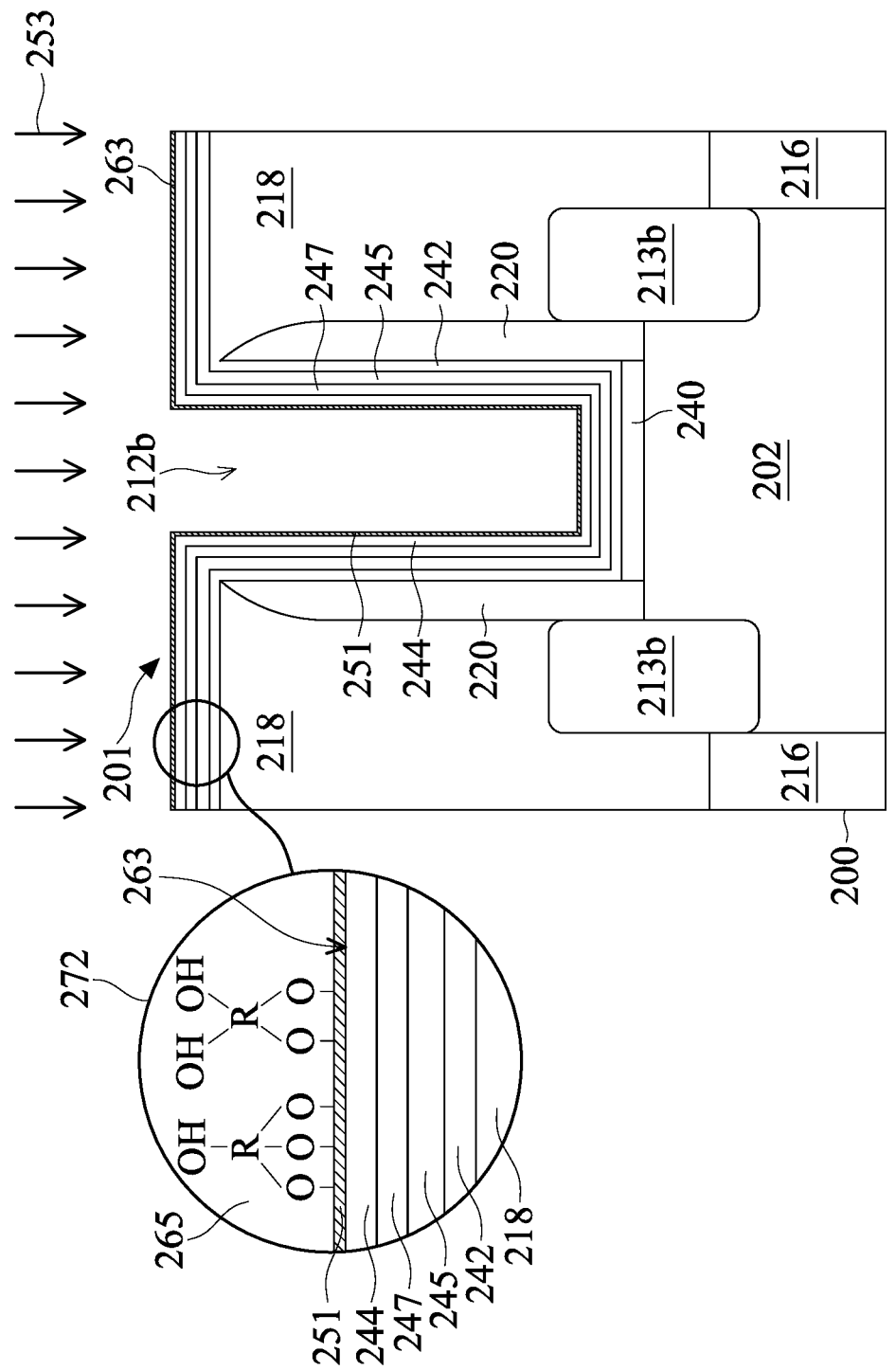

At operation 116, a pre-treatment process 253 is performed so that respective exposed layers in the trenches 230 of the FETs in the first device region 250a and in the second device region 250b are soaked in a reactant agent. The pre-treatment process 253 provides, for the exposed layers, a treated surface 261, 263 having a monolayer 251 of the reactant formed thereon, as shown in FIG. 8. The monolayer of the reactant is later oxidized and forms hydroxyl group (—OH) terminated surfaces when exposed to an external ambient such as air or oxidants. The term "soak" may refer to introducing a precursor in the chamber, then closing off the inlets and exhausts for a predetermined time (e.g., 2 seconds to 5 minutes) while the precursor adsorbs or reacts with the surface a substrate. The term "pre-treatment" may be used interchangeably with the terms "surface treatment", "pre-deposition treatment", "pre-deposition soak", "soak treatment", or "pre-soak".

In various embodiments, the reactant agent may include an aluminum-based precursor or a silicon-based precursor. Exemplary aluminum-based precursors may include, but are not limited to trimethylaluminum (TMA), triethylaluminum (TEA), dimethylethylaminealane (DMEAA), dimethylaluminum hydride (DMAH), tritertiarybutyl aluminium (TTBA), tri-isobutyl-aluminum (TIBA), triimethylylamine alane (TMAA), trimethylamine alane (TEAA), any suitable aluminum-containing metalorganic precursors, and any combination thereof. Exemplary silicon-based precursors may include, but are not limited to silanes and organosilanes. Silanes may include silane ($SiH_4$), disilane ($Si_2H_6$), trisilane ($Si_3H_8$), tetrasilane ($Si_4H_{10}$), and any combination thereof. Organosilanes may include compounds with the empirical formula $R_ySi_xH_{(2x+2-y)}$, where R is independently methyl, ethyl, propyl, or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$), tris(dimethylamino)silane (TDMAS), and any combination thereof. In some cases, the silicon-based precursor may be carbon-free.

The aluminum-based precursor and the silicon-based precursor may be chosen because the deposition thickness of a metal liner layer (e.g., TiN) subsequently deposited by ALD on a silicon-based substrate and an aluminum-based substrate after 20 ALD cycles, 40 ALD cycles, and 90 ALD cycles is found to be substantially the same. Hence, providing or passivating the surfaces of the different layers of the FETs with a monolayer 251 of aluminum or silicon can cause the metal liner layer (e.g., TiN) subsequently deposited by ALD to be formed at the same growth rate (and thus the same thickness).

The pre-treatment process 253 may be performed using a chemical vapor deposition process such as ALD, plasma enhanced atomic layer deposition (PEALD), plasma enhanced cyclic CVD (PECCVD), pulsed CVD, or any other suitable process such as an implantation process. In some embodiments, the pre-treatment process is performed using an ALD soak treatment process. During an ALD soak treatment process, the semiconductor device 201 is heated to a temperature above the condensation temperature but below the thermal decomposition temperature of a reactant agent (e.g., Al-based or Si-based precursor). The semiconductor device 201 is then exposed, soaked, or immersed in the reactant agent so that the reactant is adsorbed and reacted on the surface of the exposed layer in the trench 230 of the FET in the first device region 250a and on the surface of the exposed layer in the trench 230 of the FET in the second device region 250b. The reactant forms a monolayer 251 of the reactant (e.g., Al monolayer or Si monolayer) on the treated surfaces 261, 263. The semiconductor device 201 is then exposed to air or oxidants to allow spontaneous formation of a native oxide (e.g., aluminum oxide or silicon oxide) on the monolayer of the reactant. Insets 270, 272 in FIG. 8 are partially enlarged views showing the monolayer 251 of the reactant having a hydroxyl group (—OH) termination 265 formed on the barrier layer 247 and the work-function tuning layer 244, respectively. In the example shown in FIG. 8, the "R" represents species including aluminum (Al) or silicon (Si).

In some examples, a monolayer of aluminum oxide is formed on the barrier layer 247 of the FET in the first device region 250a and on the work-function tuning layer 244 of the FET in the second device region 250b, respectively, by an ALD soak treatment process. The ALD soak treatment process begins with setting the temperature of the semiconductor device 201 in a process chamber to a temperature range of about 20° C. to about 130° C., for example about 60° C. to about 100° C. An aluminum-based precursor, such as TMA or TEA described above, is introduced into the process chamber so that the semiconductor device 201 is soaked or immersed in the aluminum-based precursor. The TMA or TEA may be flowed into the process chamber at a flow rate of about 50 sccm to about 8000 sccm, such as about 300 sccm to about 5000 sccm, for example about 500 sccm to about 2000 sccm. The semiconductor device 201 may be soaked or immersed in the TMA or TEA for about 1 second to about 300 seconds to form a monolayer of aluminum on the surface of the barrier layer 247 and the work-function tuning layer 244, respectively. The duration of the soak may be adjusted to obtain a desired amount of aluminum on and/or in the exposed layer. In some cases, the semiconductor device 201 is soaked in the TMA or TEA for about 10 seconds to about 60 seconds. In some cases, the semiconductor device 201 is soaked in the TMA or TEA for about 5 seconds to about 20 seconds. In some cases, the semiconductor device 201 is soaked in the TMA or TEA for about 30 seconds to about 120 seconds. In some embodiments, the semiconductor device 201 is soaked in the TEA flowing at 600 sccm for about 30 seconds to about 80 seconds. The monolayer of aluminum may have a thickness of about 0.5 Å to about 20 Å, such as about 1 Å to about 10 Å, for example, about 2 Å to about 5 Å. After the TMA or TEA has adsorbed on the surface of the barrier layer 247 and the surface of the work-function tuning layer 244, the ALD control system interrupts or impedes the flow of the TMA or TEA to the process chamber. The semiconductor device 201 is then transferred to another process chamber for the subsequent deposition of a metal layer. The vacuum is broken when the semiconductor device 201 leaves the process chamber, which can introduce an oxidant to the monolayer of aluminum, resulting in conversion of aluminum monolayer to a monolayer of aluminum oxide.

In one example, a monolayer of silicon oxide is formed on the barrier layer 247 of the FET in the first device region 250a and on the work-function tuning layer 244 of the FET in the second device region 250b, respectively, by an ALD soak treatment process. The ALD soak treatment process begins with setting the temperature of the semiconductor device 201 in a process chamber to a temperature range of about 20° C. to about 130° C., for example about 60° C. to about 100° C. A silicon-based precursor, such as silanes or disilanes described above, is introduced into the process chamber so that the semiconductor device 201 is soaked or immersed in the silicon-based precursor. The silanes or disilanes may be flowed into the process chamber at a flow rate of about 50 sccm to about 8000 sccm, such as about 300 sccm to about 5000 sccm, for example about 500 sccm to about 2000 sccm. The semiconductor device 201 may be soaked or immersed in the silanes or disilanes for about 1 second to about 300 seconds to form a monolayer of silicon on the surface of the barrier layer 247 and the work-function tuning layer 244, respectively. In some cases, the semiconductor device 201 is soaked in the silanes or disilanes for about 10 seconds to about 60 seconds. In some cases, the semiconductor device 201 is soaked in the silanes or disilanes for about 5 seconds to about 20 seconds. In some cases, the semiconductor device 201 is soaked in the silanes or disilanes for about 30 seconds to about 1200 seconds. In one embodiment, the semiconductor device 201 is soaked in the silane ($SiH_4$) for about 15 seconds to about 120 seconds. In another embodiment, the semiconductor device 201 is soaked in the disilane ($Si_2H_6$) for about 15 seconds to about 60 seconds. The monolayer of silicon may have a thickness of about 0.5 Å to about 20 Å, such as about 1 Å to about 10 Å, for example about 2 Å to about 5 Å. After the silanes or disilanes has adsorbed on the surface of the barrier layer 247 and the surface of the work-function tuning layer 244, the ALD control system interrupts or impedes the flow of the silanes or disilanes to the process chamber. The semiconductor device 201 is then transferred to another process chamber for the subsequent deposition of a metal layer. The vacuum is broken when the semiconductor device 201 leaves the process chamber, which can introduce an oxidant to the monolayer of silicon, resulting in conversion of silicon monolayer to a monolayer of silicon oxide.

Alternatively or additionally, two or more reactant agents may be used in an ALD process to produce the aluminum oxide or silicon oxide. In such a case, the pre-treatment process is performed by exposing the semiconductor device 201 alternately and subsequently to pulses of two or more reactant agents, which pulses may be separated from each other by evacuation and/or purging of the process chamber. In some cases, after the adsorption of a monolayer of a first reactant agent (e.g., Al-based or Si-based precursor) on the surfaces of the respective exposed layers in the trenches 230 of the FETs in the first device region 250a and in the second device region 250b, the semiconductor device 201 is exposed to a second reactant (e.g., vapor phase $H_2O$ or other oxidants). During exposure with the second reactant, the second reactant adsorbs on and reacts with available molecules of the first reactant to form aluminum oxide or silicon oxide on a monolayer scale. This process may be repeated so that the surface layer is grown monolayer by monolayer until a desired thickness is reached.

In some examples, a monolayer of aluminum oxide is formed on the barrier layer 247 of the FET in the first device region 250a and on the work-function tuning layer 244 of the FET in the second device region 250b, respectively, by an ALD process. The ALD process begins with setting the temperature of the semiconductor device 201 in a process chamber to a temperature range of about 20° C. to about 500 C, for example about 250° C. to about 500° C. A first reactant agent, such as TMA or TEA discussed above, is pulsed into the process chamber so that the semiconductor device 201 is soaked or immersed in the TMA or TEA. The TMA or TEA may be flowed into the process chamber at a flow rate of about 10 sccm to about 6000 sccm, such as about 100 sccm to about 3000 sccm, for example about 100 sccm to about 3000 sccm. The soak time may be about 1 second to about 300 seconds to form an aluminum layer at the surface of the barrier layer 247 and the work-function tuning layer 244, respectively. For example, the soak time may be about 1 seconds to about 180 seconds. In some cases, the soak time may be about 5 seconds to about 120 seconds. In some cases, the soak time may be about 30 seconds to about 60 seconds. The pulse of the first reactant agent is followed by evacuation and/or a purge gas such as an inert gas. The inert gas may be any suitable inert gas such as argon, helium, neon, or any combinations thereof. The inert gas may be flowed into the process chamber at a flow rate of about 100 sccm to about 10000 sccm, such as about 1000 sccm to about 6000 sccm. The evacuation and/or purge gas removes any remaining TMA or TEA or by-products from the process chamber. After the evacuation and/or purge, a second reactant agent, such as water ($H_2O$), ozone ($O_3$), hydrogen peroxide ($H_2O_2$), or any other suitable oxidant, is pulsed into the process chamber. One or more second reactant agent molecules bond with the aluminum layer to form an aluminum oxide layer on a monolayer scale. The second reactant agent may be flowed into the process chamber at a flow rate of about 10 sccm to about 8000 sccm, such as about 300 sccm to about 5000 sccm, for example about 500 sccm to about 2000 sccm. The evacuation and/or purge may be performed again to remove by-products from the process chamber. These steps may be repeated in successive cycles as the aluminum oxide is built-up to the desired thickness on the surfaces of the barrier layer 247 and the work-function tuning layer 244. For example, the aluminum oxide may have a thickness of about 1 Å to about 10 Å, for example about 2 Å to about 5 Å, depending on the ALD cycles.

In some examples, a monolayer of silicon oxide is formed on the barrier layer 247 of the FET in the first device region 250a and on the work-function tuning layer 244 of the FET in the second device region 250b, respectively, by an ALD process. The ALD process begins with setting the temperature of the semiconductor device 201 in a process chamber to a temperature range of about 20° C. to about 500° C., for example about 200° C. to about 500° C. A first reactant agent, such as silanes or disilanes discussed above, is pulsed into the process chamber so that the semiconductor device 201 is soaked or immersed in the silanes or disilanes. The silanes or disilanes may be flowed into the process chamber at a flow rate of about 10 sccm to about 3000 sccm, such as about 300 sccm to about 1000 sccm, for example about 300 sccm to about 1000 sccm. The pulse time may be about 1 second to about 300 seconds to form a silicon layer at the surface of the barrier layer 247 and the work-function tuning layer 244, respectively. For example, the pulse time may be about 10 seconds to about 60 seconds. In some cases, the pulse time may be about 5 seconds to about 900 seconds. In some cases, the pulse time may be about 30 seconds to about 120 seconds. The pulse of the first reactant agent is followed by evacuation and/or a purge gas such as an inert gas. The inert gas may be any suitable inert gas such as argon, helium, neon, or any combinations thereof. The inert gas may be flowed into the process chamber at a flow rate of about 100 sccm to about 6000 sccm, such as about 1000 sccm to about 3000 sccm. The evacuation and/or purge gas removes any remaining silanes or disilanes or by-products from the process chamber. After the evacuation and/or purge, a second reactant agent, such as water ($H_2O$), ozone ($O_3$), hydrogen peroxide ($H_2O_2$), or any other suitable oxidant, is pulsed into the process chamber so that one or more second reactant agent molecules bond with the silicon layer to form a silicon oxide layer on a monolayer scale. The pulse time of the second reactant agent may be about 1 second to about 300 seconds. For example, the pulse time may be about 10 seconds to about 60 seconds. In some cases, the pulse time may be about 5 seconds to about go seconds. In some cases, the pulse time may be about 30 seconds to about 1200 seconds. The second reactant agent may be flowed into the process chamber at a flow rate of about 10 sccm to about 8000 sccm, such as about 300 sccm to about 5000 sccm, for example about 500 sccm to about 2000 sccm. The evacuation and/or purge may be performed again to remove any remaining second reactant agent and by-products from the process chamber. These steps may be repeated in successive cycles as the silicon oxide is built-up to the desired thickness on the surfaces of the barrier layer 247 and the work-function tuning layer 244. For example, the silicon oxide may have a thickness of about 1 Å to about 10 Å, for example about 2 Å to about 5 Å, depending on the ALD cycles.

In any case, the layers exposed to the pre-treatment process 253 (e.g., barrier layer 247 and work-function tuning layer 244) of the FETs are covered or passivated by a monolayer of aluminum oxide or silicon oxide after the pre-treatment process 253. The monolayer of aluminum oxide or silicon oxide is thin (e.g., less than 10 Å), and thus, may have minimized impacts on the gap-filling performance and/or threshold voltage (Vt) of other layers in the trenches 2300. When the semiconductor device 201 leaves the process chamber (e.g., for the subsequent ALD deposition of a metal layer), the monolayer of aluminum oxide or silicon oxide can be exposed to air which may further terminate the majority of dangling bonds with hydroxyl groups (—OH) that can readily react during the subsequent ALD to form a metal liner layer. Therefore, the growth rate of the subsequently deposited metal liner layer may not depend on a varying substrate surface (e.g., of the barrier layer 247 or work-function tuning layer 244). Instead, the pre-treated barrier layer and the work-function tuning layer provide the same starting surface for the subsequent ALD for a metal liner layer. As a result, the loading effect for the subsequent ALD due to substrate dependent growth may be mitigated.

Figure 9:
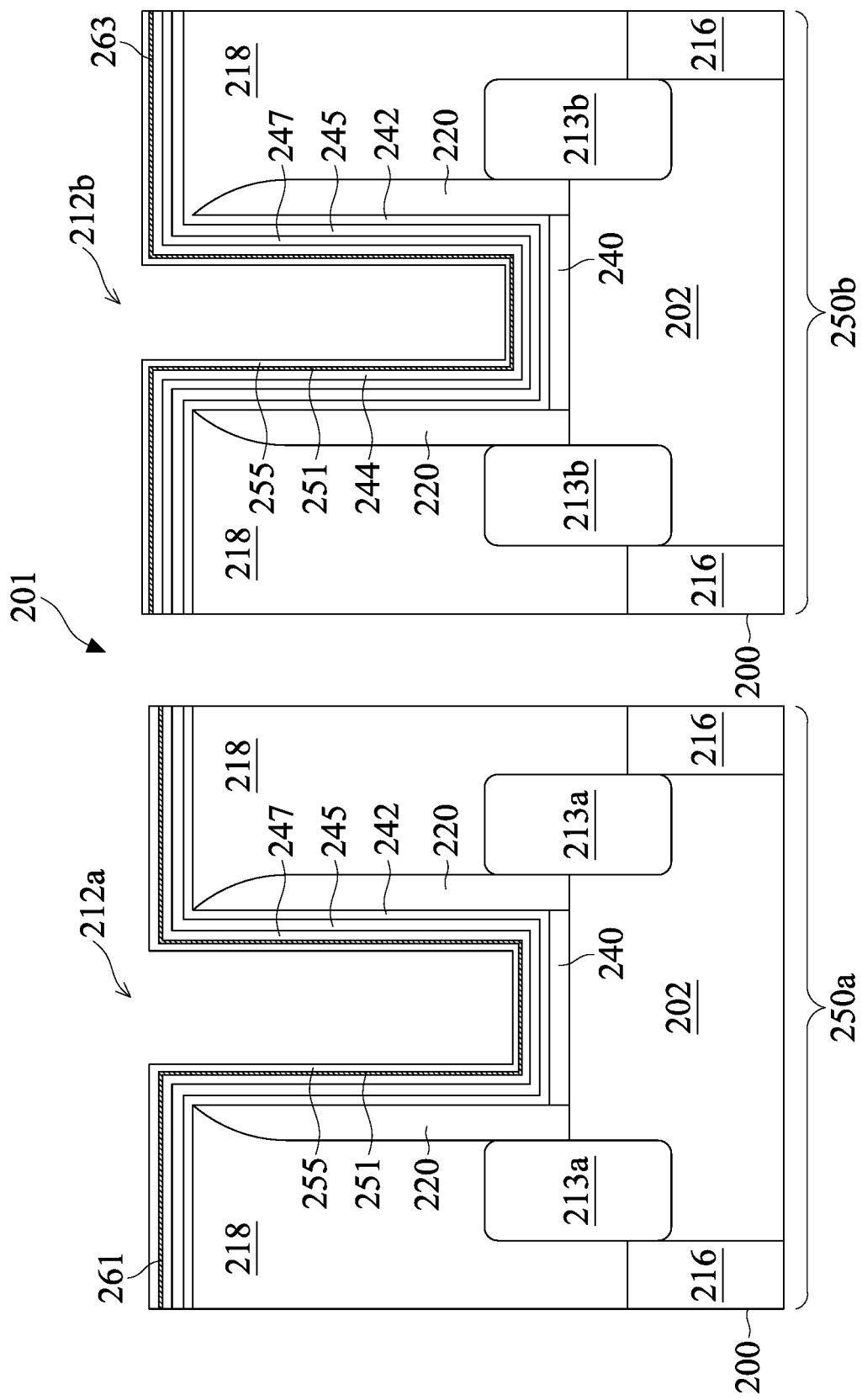

At operation 118, after the surfaces of the exposed layers (e.g., barrier layer 247 in the trench 230 of the FET in the first device region 250a and the work-function tuning layer 244 in the trench 230 of the FET in the second device region 250b) have been treated, a metal liner layer 255 is conformally deposited in the trenches 230 (e.g., on treated surfaces 261, 263 of the barrier layer 247 and the work-function tuning layer 244), as shown in FIG. 9. The metal liner layer 255 may be fabricated from a material similar to the capping layer 245, for example. For example, the metal liner layer 255 may be or include a nitride, silicon nitride, carbon nitride, and/or aluminum nitride of tantalum and/or titanium; a nitride, carbon nitride, and/or carbide of tungsten; the like; or a combination thereof. In some examples, the metal liner layer 255 is TiN. In some examples, the metal liner layer 255 is TaN. In some examples, the metal liner layer 255 is TiON. In some examples, the metal liner layer 255 is TaON. While a single layer of the metal liner layer 255 is shown, it is contemplated that the metal liner layer 255 may include one or more other layers described herein. The metal liner layer 255 and any other layers deposited over the treated surfaces 261, 263 may also be used to set the value of the work function of the gate electrode metal 257. The metal liner layer 255 is deposited by ALD in some examples, although in other examples, the metal liner layer 255 may be deposited by PECVD, MBD, or any deposition technique.

In some embodiments, during the formation of the metal liner layer 255, the oxygen in the monolayer may also react with the precursor used for the metal liner layer 255 and form a mixing layer between the metal liner layer 255 and the monolayer 251 (of aluminum oxide or silicon oxide). Insets 297, 299 in FIG. 9 are partially enlarged views showing one embodiment where the mixing layer 293, 295 is formed on the monolayer 251 in the first device region 250a and the second device region 250b, respectively. Depending on the material of the metal liner layer 255 and the monolayer, the mixing layer can be a compound of titanium aluminum oxide (Al—Ox—Ti), for example. In addition, since the oxygen is purged out during the formation of the metal liner layer 255, the oxygen level in the monolayer may be lower than that before the formation of the metal liner layer 255.

Due to the pre-treatment process 253, the growth rate of the metal liner layer 255 deposited by ALD on the barrier layer 247 and the work-function tuning layer 244 is almost identical because the same starting surface (e.g., the treated surfaces 261, 263 having an aluminum oxide or silicon oxide monolayer) is provided for both the FET in the first device region 250a and the FET in the second device region 250b. As a result, metal liner layer 255 can have uniform thickness on the barrier layer 247 and the work-function tuning layer 244. In addition, the incubation time of the metal liner layer 255 on the barrier layer 247 and the work-function tuning layer 244 during the ALD is improved due to the aluminum oxide or silicon oxide monolayer having hydroxyl group (—OH) termination 265, which is believed to promote the chemical reaction with one or more precursor of the ALD for forming the metal liner layer 255. For example, it has been observed that soaking the barrier layer (e.g., TaN) in TEA (flowed at 600 sccm) for 15 seconds would result in the thickness of the metal liner layer (e.g., TiN) increased by about 46% as compared to the case where no soaking is performed on the barrier layer; soaking the barrier layer (e.g., TaN) in TEA (flowed at 600 sccm) for to seconds would result in the thickness of the metal liner layer (e.g., TiN) increased by about 40% as compared to the case where no soaking is performed on the barrier layer; and soaking the barrier layer (e.g., TaN) in TEA (flowed at 600 sccm) for 5 seconds would result in the thickness of the metal liner layer (e.g., TiN) increased by about 32% as compared to the case where no soaking is performed on the barrier layer. Similar growth patterns were also observed on the work-function tuning layer. These observations show the incubation of the metal liner layer during the ALD is enhanced on the treated surfaces 261, 263 by using Al-based pre-soak process. Hence, after depositing the metal liner layer 255, the metal liner layer 255 is on the monolayer of aluminum oxide or silicon oxide, in some embodiments.

Figure 10:
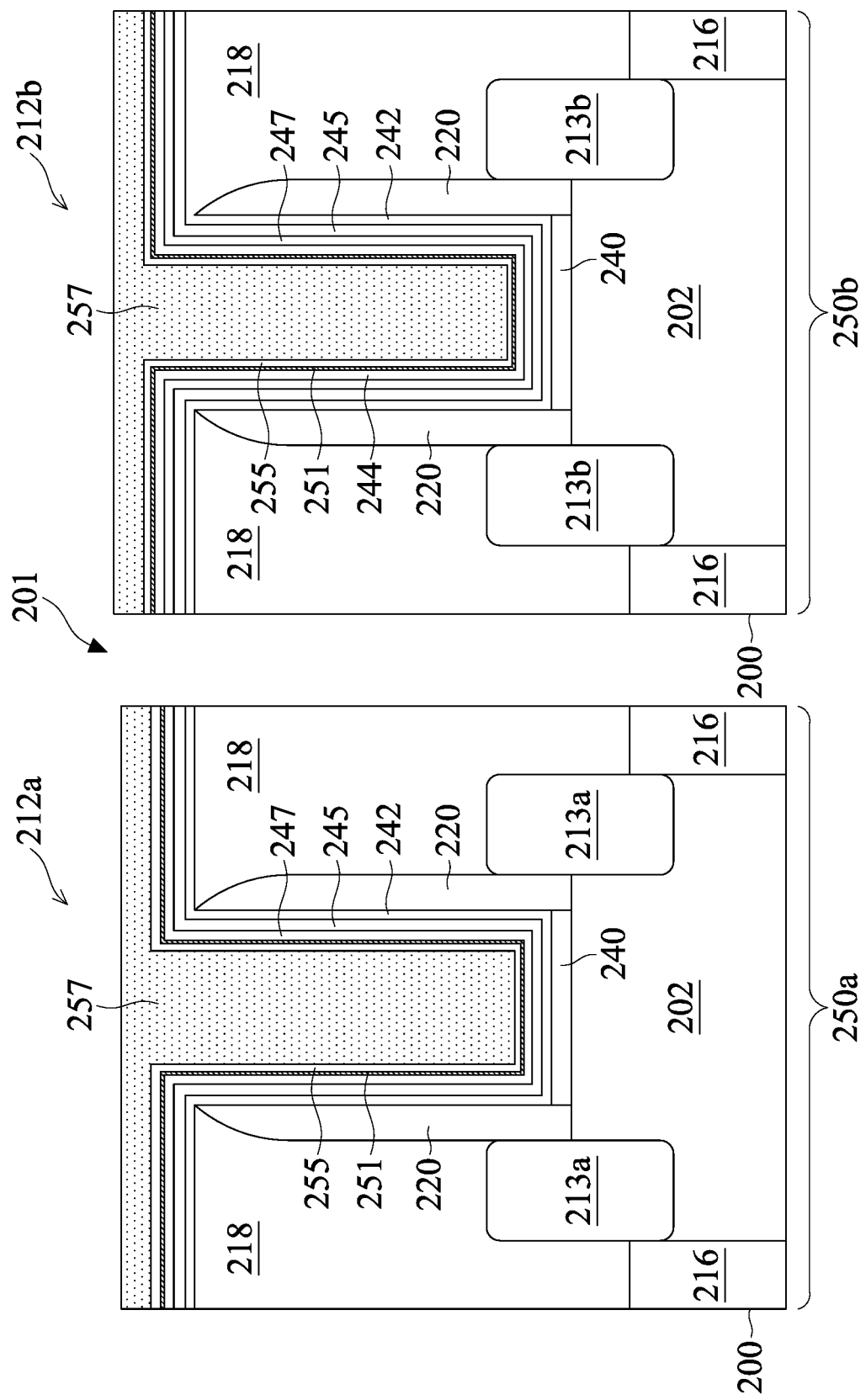

At operation 120, after the metal liner layer 255 has been formed on the treated surfaces 261, 263, a gate electrode metal 257 is formed over the metal liner layer 255 and filled the trenches 230 defined in the ILD 218 for the replacement gate structures 212a, 212b. The gate electrode metal 257 may overburden the trenches 230 to a predetermined thickness, as shown in FIG. 10. In various embodiments, the gate electrode metal 257 may be or include a conductive material, such as aluminum (Al), copper (Cu), titanium (Ti), tantalum (Ta), titanium aluminum (AlTi), titanium aluminum nitride (TiAlN), titanium (Ti), titanium nitride (TiN), tantalum nitride (TaN), tantalum silicon nitride (TaN), tantalum aluminum (AlTa), tantalum (Ta), nickel silicide, cobalt silicide, TaC, titanium silicon nitride (TaSiN), tungsten (W), tungsten nitride (WN), molybdenum nitride (MoN), platinum (Pt), ruthenium (Ru), other suitable conductive materials, or a combination thereof. In some examples, the gate electrode metal 257 is tungsten. Depending upon the material of the layer to be formed, the gate electrode metal 257 may be formed by CVD, PECVD, PVD, plating, ALD, and/or other suitable processes.

Figure 11:
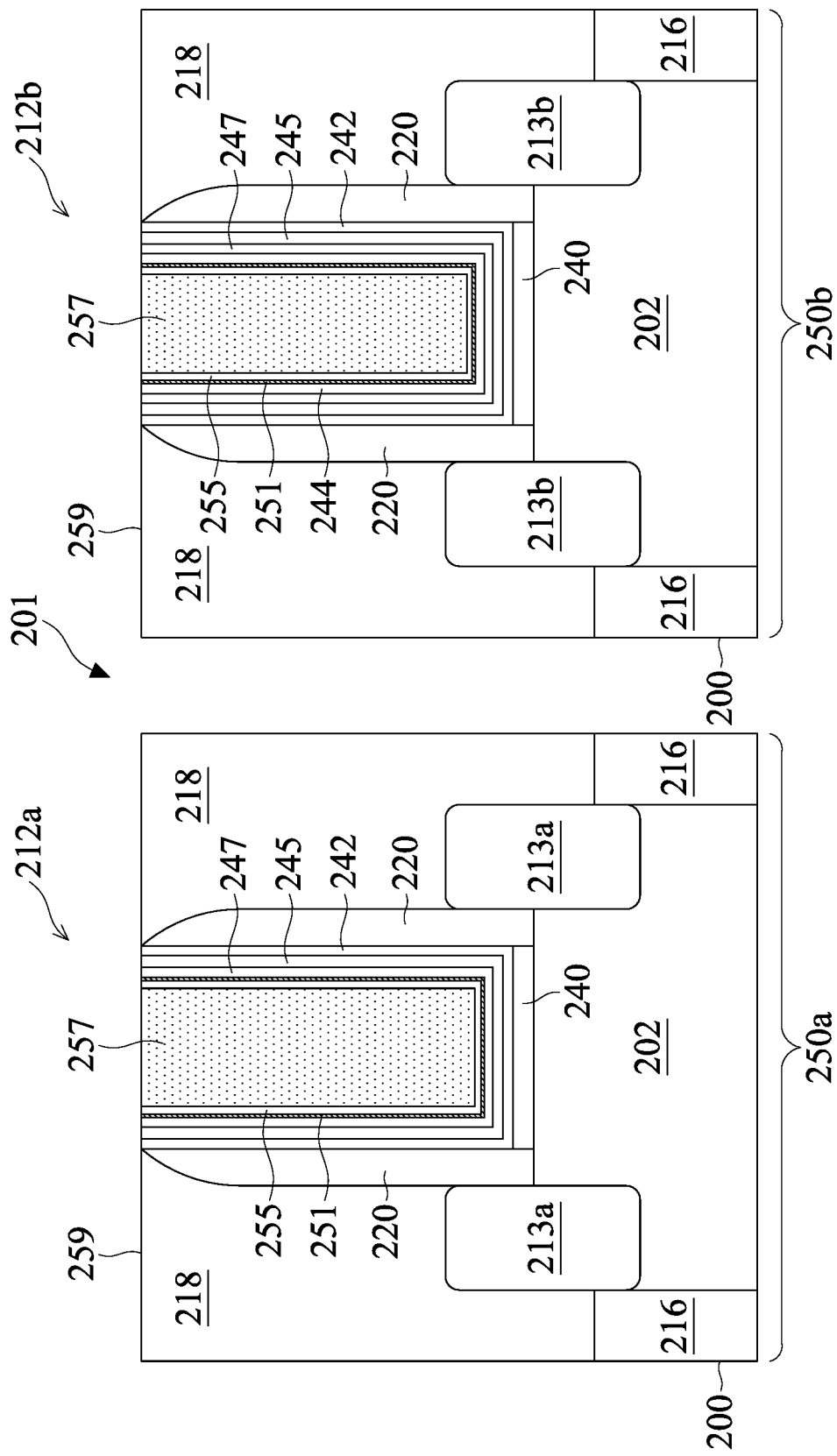

At operation 122, a planarization process, such as a CMP, may be used to planarize a top surface of the semiconductor device 201. The planarization process may remove portions of the gate electrode metal 257, the metal liner layer 255, the monolayer 251, the barrier layer 247, the capping layer 245, the work-function tuning layer 244, and the gate dielectric layer 242 from that are above the top surface of the ILD 218, as shown in FIG. 11. Upon completion of the planarization process, a fresh top surface 259 of the ILD 218 is exposed.

The semiconductor device 201 fabricated according to the flow chart 100 may undergo further processing to form various features and regions. For example, subsequent processing may form various contacts/vias/lines and multilayers of interconnect features (e.g., metal layers and interlayer or intermetal dielectrics) on the substrate 200 including the semiconductor device 201, configured to connect the various features to form a functional circuit that may include one or more devices (e.g., one or more semiconductor devices 201). The various interconnection features may employ various conductive materials including copper, tungsten, and/or silicide. In one example, a damascene and/or dual damascene process may be used to form a copper related multilayer interconnection structure. Furthermore, additional process steps may be implemented before, during, and after the flow chart 100, and some operations described above may be replaced or eliminated depending upon the application.

Figure 12:
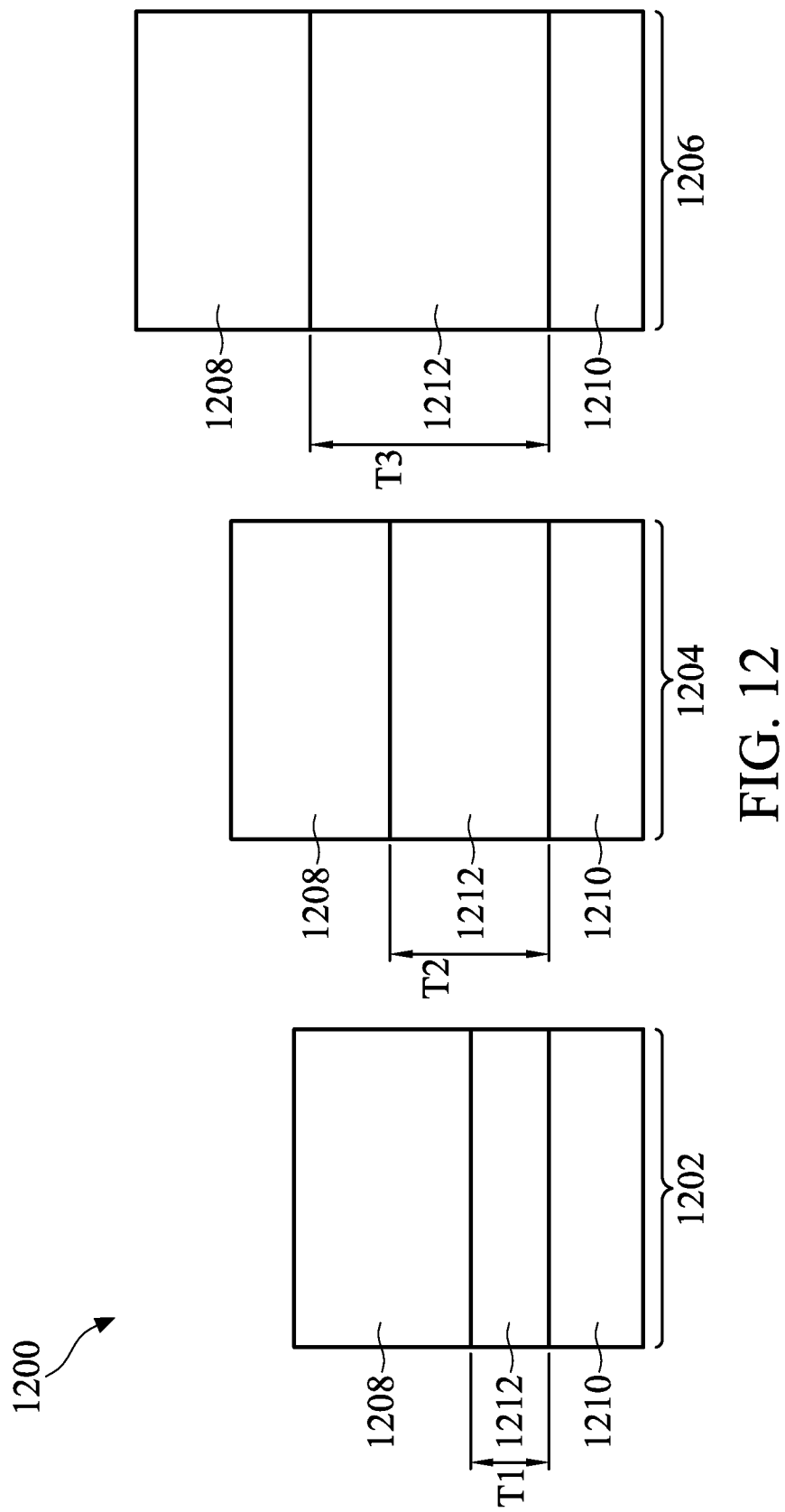
FIG. 12 illustrates a simplified semiconductor device at an intermediate stage of processing showing portions of gate structures in three device regions.

While various embodiments discussed above mitigate the substrate dependent loading by pre-treating exposed surfaces of a barrier layer and/or a work-function tuning layer to provide the same starting surface for the subsequent ALD, it has been observed that the substrate dependent growth of the work function metals can instead be used for tuning the threshold voltage for n-FET or p-FET devices to achieve a multiple threshold voltage scheme. In some multi-Vt metal gates, a semiconductor device may include two or more device regions and each device region may include a p-type device or n-type device. FIG. 12 illustrates a simplified semiconductor device 1200 at an intermediate stage of processing showing portions of the gate structures in three device regions 1202, 1204, 1206. Each device region includes an n-type device. Each n-type device in the device regions 1202, 1204, 1206 has a work-function tuning layer 1208 disposed over a gate dielectric layer 1210. A metal layer 1212, such as a work-function tuning layer for a p-type device, such as TiN, TaN, TiAlN, TiSiN, is often formed with different thicknesses between the work-function tuning layer 1208 and the gate dielectric layer 1210 to affect the work function for the metal gates. In the example shown in FIG. 12, the metal layer 1212 in the device region 1202 has a first thickness T1; the metal layer 1212 in the device region 1204 has a second thickness T2 greater than the first thickness T1; and the metal layer 1214 in the device region 1206 has a third thickness T3 greater than the second thickness T2. Since the work function of metal gates depends in part on the conductivity of the metal layer 1212, providing the same metal layer 1212 with different thickness can effectively change and separate the work function of different metal gates in the device regions 1202, 1204, 1206. With scaling of FinFET devices, however, multi-Vt tuning using different film thickness may not be practical since the space for the metal layer can be reduced or limited.

Figure 13:
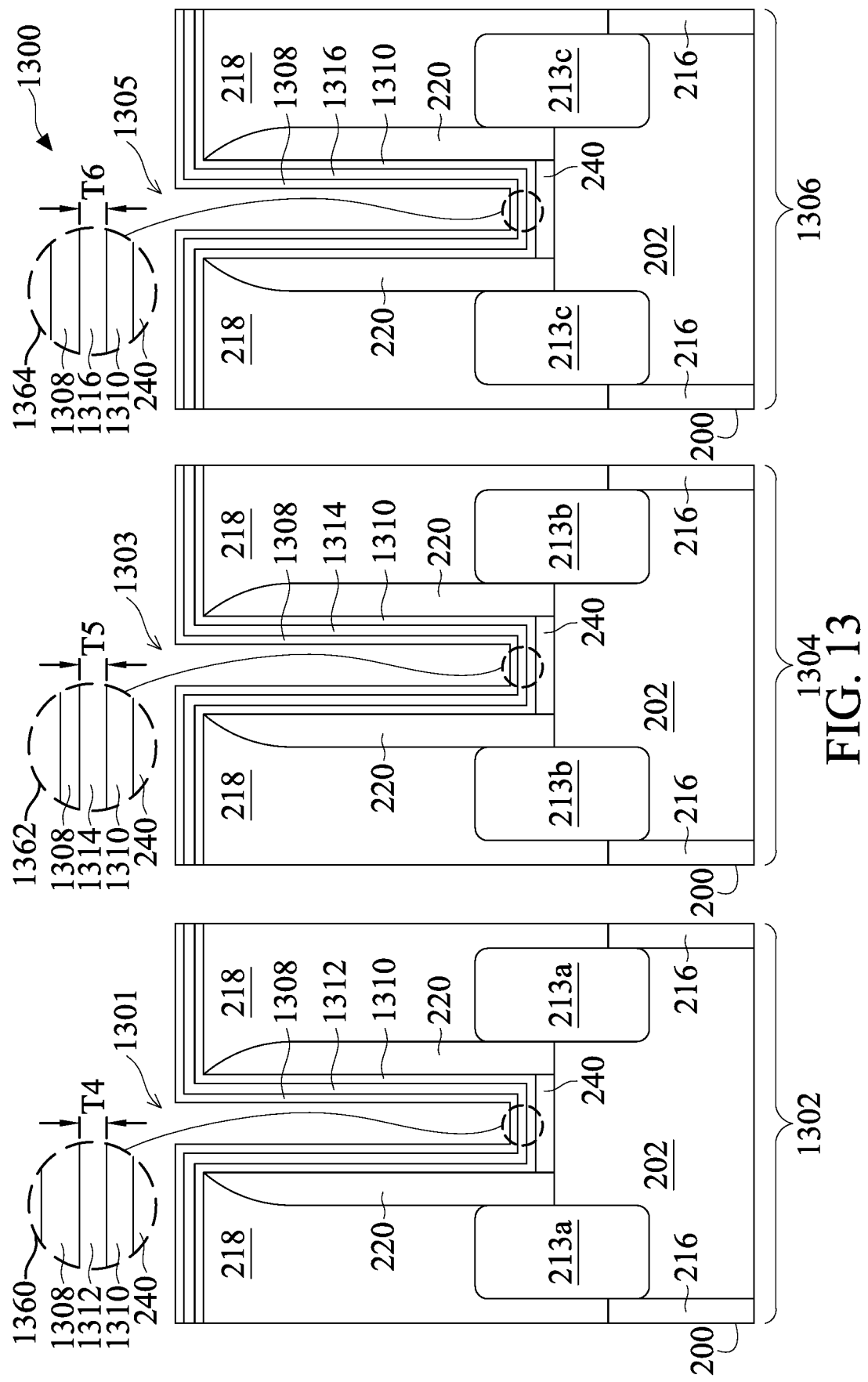
FIG. 13 illustrates a simplified semiconductor device at an intermediate stage of processing according to some embodiments.

Various embodiments discussed herein provide multi-Vt tuning for n-type or p-type devices without forming multilayers of film stacks between the work-function tuning layer and the gate dielectric layer. Instead, the work function of metal gates at different device regions can be adjusted by providing a different metal layer between the work-function tuning layer and the gate dielectric layer for n-type or p-type devices. Since some work function materials can have very strong substrate dependent growth behavior, the composition and thickness of the work-function tuning layer at different device regions may be changed due to a different metal layer disposed underneath the work-function tuning layer. FIG. 13 illustrates a simplified semiconductor device 1300 at an intermediate stage of processing according to some embodiments. The semiconductor device 1300 may be a multi-threshold voltage IC device, such as the semiconductor device 201 discussed above. For clarity, only a portion of the gate structure shown in the insets 1360, 1362, 1364 will be discussed. Other elements of the semiconductor device 1300, such as source/drain regions 213a-c, gate spacers 220, isolation regions 216, fins 202, and ILDs 218, etc., can be referred to the semiconductor device 201 as discussed above with respect to FIG. 5.

In an embodiment, the semiconductor device 1300 has three device regions 1302, 1304, 1306, and each device region includes an n-type device. Similar to the semiconductor device 201 discussed above, the n-type device in the device regions 1302, 1304, 1306 can be an n-type low threshold voltage (N-LVT) device, an n-type standard threshold voltage (N-SVT), or an n-type high threshold voltage (N-HVT) device, depending upon the application. While the n-type device is discussed herein, it is contemplated that the concept is also applicable to p-type device, such as a p-type FinFET device. Each n-type device in the device regions 1302, 1304, 1306 has a work-function tuning layer 1308 disposed over a gate dielectric layer 1310. Similar to the work-function tuning layer 244 discussed above, suitable examples of the work-function tuning layer 1308 may include Ti, Al, TaAl, TaAlC, TiAlC, TiAlO, HfAl, TiAl, TaC, TaCN, TaSiN, Mn, Zr, or other suitable materials having a work function ranging between 3.9 eV and 4.3 eV. In an embodiment, the work-function tuning layer 1308 is TiAlC. Similar to the gate dielectric layer 242, the gate dielectric layer 1310 may include or be silicon oxide, silicon nitride, a high-k dielectric material, multilayers thereof, or other suitable dielectric material. In some embodiments, the gate dielectric layer 1310 may be a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

Metal layers 1312, 1314, 1316 are provided between the work-function tuning layer 1308 and the gate dielectric layer 1310 in the respective device region 1302, 1304, 1306 to tune the work function value for the metal gates. The metal layers 1312, 1314, 1316 may be TiN, TaN, TiAlN, TiSiN, a composite containing metal nitride (such as TiN—$Si_3N_4$, TSN), or any suitable metal, such as those used for the capping layer 245 and the barrier layer 247 as discussed above. In an embodiment, the thickness "T4" of the metal layer 1312, the thickness "T5" of the metal layer 1314, and the thickness "T6" of the metal layer 1316 are substantially the same, for example about 10 Å. In some examples, the thickness of each of "T4", "T5" and "T6" may be in a range of about 5 Å to about 15 Å, for example about 8 to about 12 Å. Unlike the semiconductor device 1200 of FIG. 12 where the same metal layer 1212 is formed with various thicknesses for n-FET multi-Vt tuning, the metal layers 1312, 1314, 1316 can be chemically different from each other. In an example embodiment, the metal layer 1312 in the device region 1302 is TiN; the metal layer 1314 in the device region 1304 is TaN; and the metal layer 1316 in the device region 1306 is TSN. Since the work-function tuning layer 1308 (e.g., TiAlC) can have very strong substrate dependent growth behavior (meaning the composition and thickness of TiAlC is substrate dependent), the use of different metal layers at respective device regions 1302, 1304, 1306 can result in the TiAlC to form with different film properties and thickness, which in turn changes the work function value of the work-function tuning layer 1308. In some embodiments, the difference between the thickness of TiAlC on TSN and the thickness of TiAlC on TaN can be about 12% to about 15%, and the different between the thickness of TiAlC on TiN substrate and the thickness of TiAlC on TaN can be about 28% to about 39%.

Figure 14A:
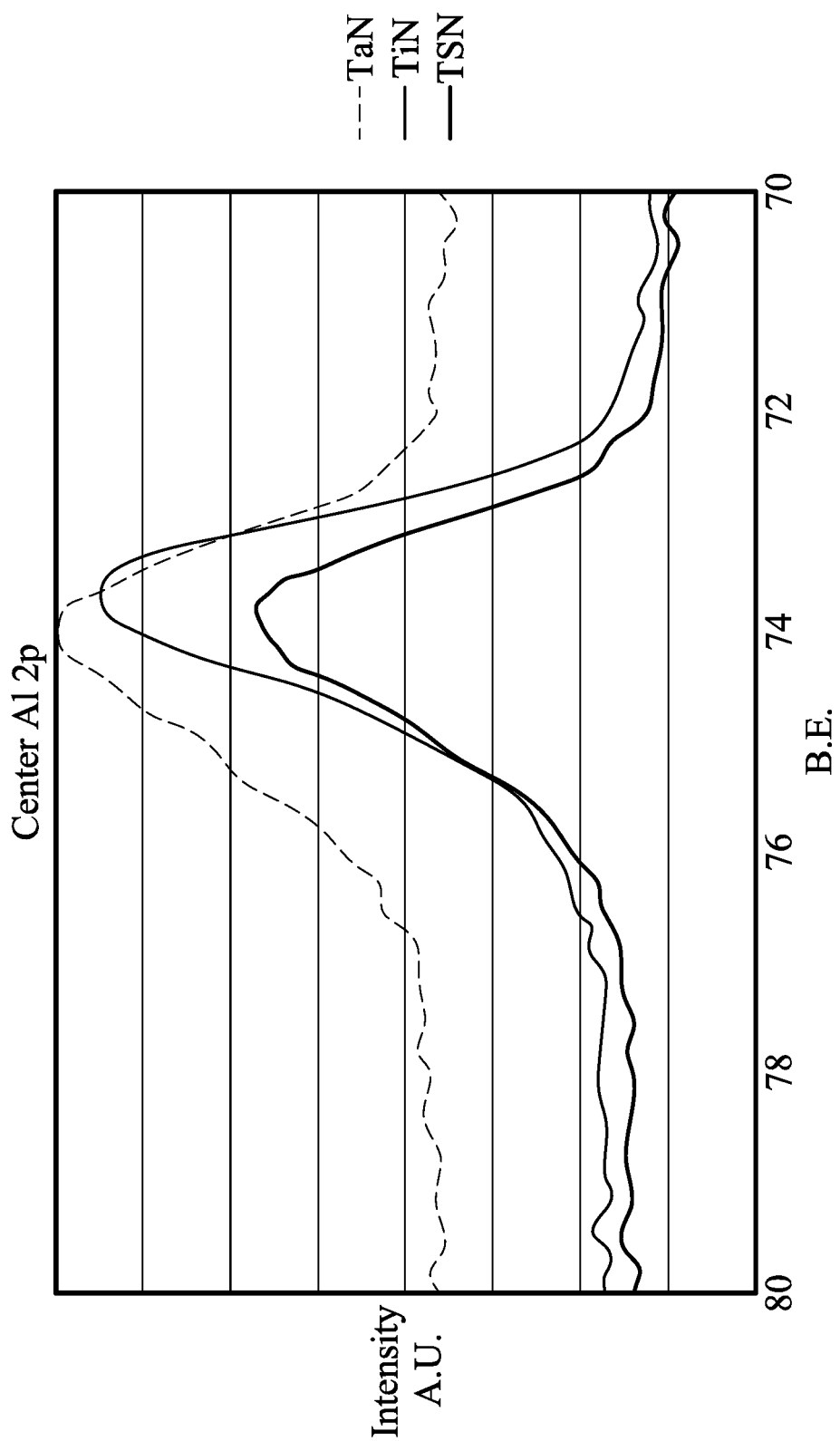
FIGS. 14A to 14C show XPS spectra of TiAlC deposited on different substrates according to some embodiments.
Figure 14B:
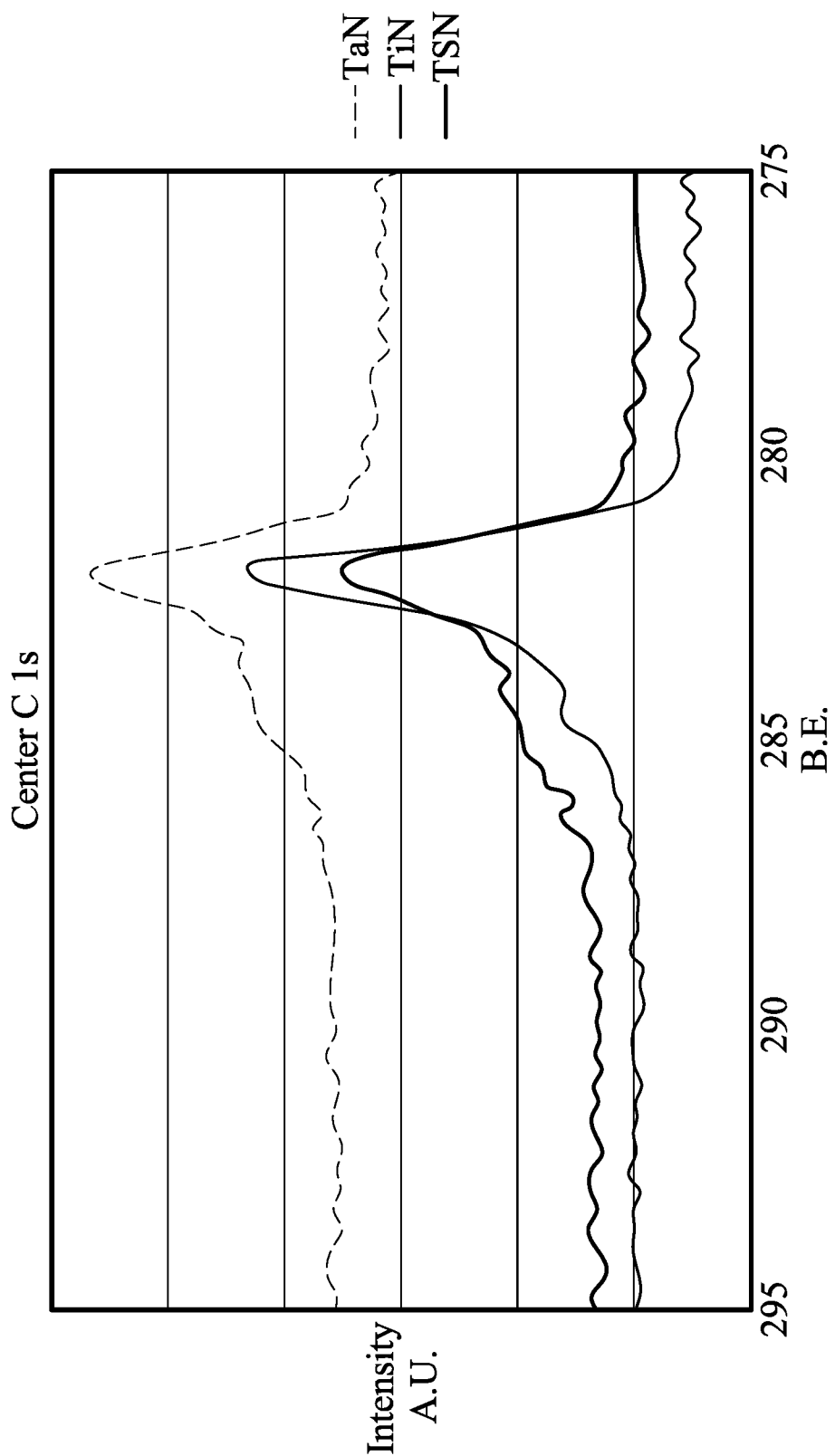
Figure 14C:
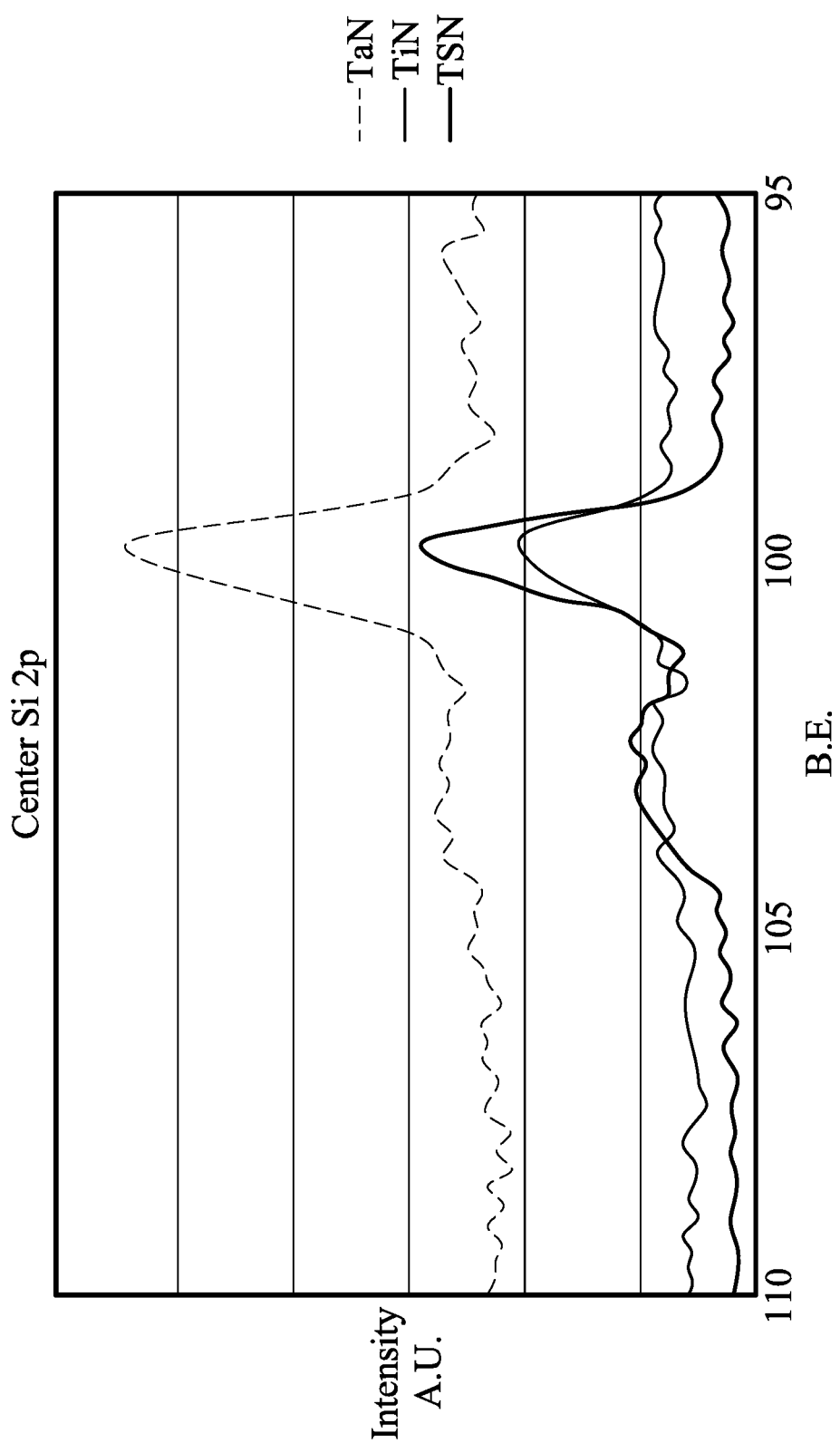

FIGS. 14A to 14C show X-ray photoelectron spectroscopy (XPS) spectra of main component of the TiAlC deposited on TSN, TaN, and TiN substrates. The measured photoelectron intensity in arbitrary unit (A.U) is plotted as function of the binding energy (B.E). XPS employs X-rays to eject core electrons of the atoms present on the surface of TiAlC. The kinetic energy of these electrons is measured to obtain the binding energy of the electrons of interest, such as Al, C, and Si. The TiAlC was deposited on TSN, TaN, and TiN substrates at a temperature of about 350° C. to about 420° C. and a chamber pressure of about 1 Torr to about 20 Torr. As for aluminum (Al 2p) spectrum in FIG. 14A (meaning the peaks of measured electrons of Al atoms were emitted from the shell 2p), TiAlC deposited on TiN shows highest signal spectrum of Al (by subtracting a background spectrum of about 1.8 from a measured spectrum of about 4.7), while TiAlC deposited on TaN and TiAlC deposited on TSN both show lower signal spectrum of Al, meaning more aluminum is found in TiAlC when deposited on TiN substrate. Therefore, TiAlC on TiN substrate can have more positive charge carriers than TiAlC on TaN or TSN substrate due to higher concentration of Al in TiAlC.

As for carbon (C 1s) spectrum in FIG. 14B (meaning the peaks of measured electrons of C atoms were emitted from the shell 1s), TiAlC deposited on TiN also shows highest signal spectrum of C (by subtracting a background spectrum of about 4 from a measured spectrum of 7.3), while TiAlC deposited on TaN and TiAlC deposited on TSN both show lower signal spectrum of C, meaning more carbon is found in TiAlC when deposited on TiN substrate.

As for silicon (Si 2p) spectrum in FIG. 14C (meaning the peaks of measured electrons of Si atoms were emitted from the shell 2p), TiAlC deposited on TaN shows highest signal spectrum of Si (by subtracting a background spectrum of about 2.7 from a measured spectrum of 4.5), while TiAlC deposited on TiN shows lowest signal spectrum of Si, meaning more silicon is found in TiAlC when deposited on TaN substrate. Higher Si intensity found in TiAlC suggests the thickness of TiAlC on TaN is thinner than that of TiAlC on TiN since Si signal from the underlying fin (e.g., fin 202) is easily detected.

The XPS spectra of FIGS. 14A to 14C indicate that providing different substrates can result in different film properties and thickness of TiAlC. Therefore, by using different metal layer at respective device regions 1302, 1304, 1306, TiAlC can be formed with distinguished film properties and thickness. The distinguished TiAlC films on different substrates provide different n-type work functions for the purpose of multi-Vt tuning without stacking multi-layers of the metal layer. As a result, more space can be provided for filling metal gate or other suitable work-function tuning layers for the device.

An example process of forming different metal layer in respective device regions 1302, 1304, 1306 may be performed as follows. After forming the gate dielectric layer 1310 in the trenches 1301, 1303, 1305 between the gate spacers in the device regions 1302, 1304, 1306, a first metal layer 1312, such as TiN, is formed over the gate dielectric layer 1310 in the trenches 1301, 1303, 1305 of the device regions 1302, 1304, 1306, respectively. A patterned mask, such as the patterned mask structure 248 discussed above, is then disposed on the device region 1302 of the semiconductor device 1300. The patterned mask overfills the trench and covers the exposed surface of the device region 1302, while exposing the device regions 1304 and 1306 for further processing such as etching. One or more etch processes may then be performed to selectively remove the metal layer 1312 from the trenches of the device regions 1304 and 1306, leaving the first metal layer 1312 in the trench of the device region 1302.

A second metal layer 1314, such as TaN, is then formed in the trenches in the device regions 1302, 1304, 1306, respectively. Likewise, a patterned mask is disposed on the device region 1304 of the semiconductor device 1300. One or more etch processes may then be performed to selectively remove the metal layer 1314 from the trenches of the device regions 1302 and 1306, leaving the second metal layer 1314 in the trench of the device region 1304. Thereafter, a third metal layer 1316, such as TSN, is formed in the trenches in the device regions 1302, 1304, 1306, respectively. A patterned mask is disposed on the device region 1306 of the semiconductor device 1300. One or more etch processes may then be performed to selectively remove the metal layer 1316 from the trenches of the device regions 1302 and 1304, leaving the third metal layer 1316 in the trench of the device region 1306. In this way, the first metal layer 1312 (e.g., TiN) can be formed in the device region 1302 between the gate dielectric layer 1310 and the work-function tuning layer 1308, the second metal layer 1314 (e.g., TaN) can be formed in the device region 1304 between the gate dielectric layer 1310 and the work-function tuning layer 1308, and the third metal layer 1316 (e.g., TSN) can be formed in the device region 1306 between the gate dielectric layer 1310 and the work-function tuning layer 1308. With this approach, the composition and thickness of the work-function tuning layer 1308 (e.g., TiAlC) can be changed as needed for the purpose of multi-Vt tuning.

After the work-function tuning layer 1308 has been formed on the metal layers 1312, 1314, 1316 in the respective device regions 1302, 1304, 1306, processing on the semiconductor device 1300 may be proceed to form a metal liner layer and a gate electrode metal as discussed above with respect to FIGS. 9 through 11. The semiconductor device 1300 may undergo further processing to form various features and regions, such as contacts/vias/lines and multi-layers of interconnect features, that may be required to form a functional integrated device.

Various embodiments described herein may offer several advantages. It will be understood that not all advantages have been necessarily discussed herein, no particular advantage is required for any embodiment, and other embodiments may offer different advantages. As one example, embodiments discussed herein include methods and structures directed to a pre-deposition treatment process which includes soaking a particular layer such as a work-function tuning layer, a barrier layer, a capping layer, other appropriate next metal layer, etc. that has been deposited in a trench of a FET (e.g., for the SVT device) and a trench of another FET (e.g., for the uLVT device) in a reactant agent to provide a treated surface prior to deposition of a subsequent metal liner layer over the treated surface of the particular layer. In various embodiments, the pre-deposition treatment process forms a monolayer of the reactant on the treated surface. The monolayer of the reactant can be oxidized by exposing to an external ambient or any suitable oxidants which terminates the treated surface with hydroxyl group (—OH) that can readily react with the subsequent metal liner layer. By employing the pre-deposition treatment process, the work function of the subsequently deposited metal liner layer may not depend on the quality of an underlying surface (e.g., such as an underlying work-function tuning layer having an oxidized surface layer). In addition, the growth rate of the subsequently deposited metal liner layer may not depend on a varying substrate surface of the particular layer that can affect the growth rate (and thus the thickness) of the subsequently deposited metal liner layer. Instead, the treated surface of the particular layer having a monolayer of the reactant provides generally the same starting surface for the subsequent metal liner layer deposition. Furthermore, the monolayer of the reactant can be thin (e.g., less than 10 Å), and thus, can have minimized impacts on the gap-filling performance and/or threshold voltage (Vt) of other layers in the trenches. As a result, the loading effect for the subsequent metal liner layer due to substrate dependent growth can be mitigated.

Other advantages may include multi-Vt tuning for n-type or p-type devices by providing different or distinct metal layer between the work-function tuning layer and the gate dielectric layer for different device regions of a FET, such as an n-FET or p-FET device. The distinct metal layer can affect the composition and thickness of the work-function tuning layer, thereby changing the work function value of the work-function tuning layer deposited thereon. The distinguished work-function tuning layers (e.g., TiAlC) on different substrates provide different n-type work functions for the purpose of multi-Vt tuning without stacking multi-layers of the metal layer. As a result, more space can be provided for filling metal gate or other suitable work-function tuning layers for the device.

In one embodiment, a method for semiconductor processing is provided. The method includes exposing a first metal-containing layer of a first device and a second metal-containing layer of a second device to a reactant to form respective monolayers on the first metal-containing layer and the second metal-containing layer, the first device and the second device being on a substrate, the first device comprising a first gate structure including the first metal-containing layer, the second device comprising a second gate structure including the second metal-containing layer, the first metal-containing layer being a different material from the second metal-containing layer. The method also includes exposing the monolayers on the first metal-containing layer and the second metal-containing layer to an oxidant to provide a hydroxyl group (—OH) terminated surface for the monolayers on the first metal-containing layer and the second metal-containing layer, and forming a third metal-containing layer on the —OH terminated surfaces of the monolayers on the first metal-containing layer and the second metal-containing layer.

Another embodiment is a semiconductor device. The semiconductor device includes a substrate, and a first device having a first gate structure over the substrate. The first gate structure includes a gate dielectric layer over the substrate, a barrier layer over the gate dielectric layer, a monolayer of aluminum oxide or silicon oxide on the barrier layer, a metal liner layer over the monolayer of aluminum oxide or silicon oxide on the barrier layer, and a gate electrode metal over the metal liner layer.

In one yet embodiment a method is provided. The method includes forming a gate dielectric layer in a first trench and a second trench, the first trench and the second trench each being defined in a dielectric structure and intersecting a respective fin on a substrate, forming a first metal layer over the gate dielectric layer in the first trench, forming a second metal layer over the gate dielectric layer in the second trench, wherein the first metal layer and the second metal layer are chemically different from each other, forming a work-function tuning layer directly on the first metal layer in the first trench and the second metal layer in the second trench, respectively, the work-function tuning layer having a different thickness on the first metal layer than the second metal layer, and forming respective gate electrodes over the work-function tuning layer in the first trench and the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for semiconductor processing, the method comprising:
   forming a gate dielectric layer in a first trench and a second trench, the first trench and the second trench each being defined in a dielectric structure and intersecting a respective fin on a substrate;
   forming a first metal layer over the gate dielectric layer in the first trench;
   forming a second metal layer over the gate dielectric layer in the second trench, wherein the first metal layer and the second metal layer are chemically different from each other;
   forming a work-function tuning layer directly on the first metal layer in the first trench and the second metal layer in the second trench, respectively, the work-function tuning layer having a different thickness on the first metal layer than the second metal layer; and
   forming respective gate electrodes over the work-function tuning layer in the first trench and the second trench.

2. The method of claim 1, further comprising:
   forming the gate dielectric layer in a third trench, the third trench being defined in the dielectric structure and intersecting a respective fin on the substrate;
   forming a third metal layer over the gate dielectric layer in the third trench, wherein the third metal layer is chemically different from the first metal layer and the second metal layer;
   forming the work-function tuning layer directly on the third metal layer in the third trench, the work-function tuning layer having a different thickness on the third metal layer than on the first metal layer and on the second metal layer; and
   forming a gate electrode over the work-function tuning layer in the third trench.

3. The method of claim 2, wherein the work-function tuning layer comprises TaAl, TaAlC, TiAlC, TiAlO, HfAl, TiAl, TaC, TaCN, TaSiN, or a combination thereof.

4. The method of claim 3, wherein the work-function tuning layer is TiAlC.

5. The method of claim 2, wherein the first metal layer, the second metal layer, and the third metal layer each comprises TiN, TaN, TiAlN, TiSiN, or TSN (TiN—$Si_3N_4$).

6. The method of claim 5, wherein the first metal layer is TiN, the second metal layer is TaN, and the third metal layer is TSN.

7. The method of claim 2, wherein the first metal layer, the second metal layer, and the third metal layer have a substantially same thickness.

8. A method for semiconductor processing, the method comprising:
forming a gate dielectric layer in a first trench and a second trench, the first trench and the second trench each being defined in a dielectric structure and intersecting a respective fin on a substrate;
forming a first metal layer of a first material over the gate dielectric layer in the first trench;
forming a second metal layer of a second material over the gate dielectric layer in the second trench, wherein the first material is different than the second material;
forming a work-function tuning layer of a third material directly on the first metal layer in the first trench and the second metal layer in the second trench, wherein a deposition rate of the third material on the first material of the first metal layer is different than a deposition rate of the third material on the second material of the second metal layer; and
forming a first gate electrode over the work-function tuning layer in the first trench and a second gate electrode over the work-function tuning layer in the second trench.

9. The method of claim 8, wherein the first gate electrode is a gate electrode of a first n-type FinFET and the second gate electrode is a gate electrode of a second n-type FinFET.

10. The method of claim 8, wherein a thickness of the first metal layer and the second metal layer is in a range of about 5 Å to about 15 Å.

11. The method of claim 8, wherein a thickness of the first metal layer is a substantially equal to a thickness of the second metal layer.

12. The method of claim 8, wherein the first material comprises one of TaN, TiN, or TSN, wherein the second metal layer comprises another one of TaN, TiN, or TSN.

13. The method of claim 12, wherein the work-function tuning layer comprises TiAlC.

14. The method of claim 13, wherein a difference in a thickness of the work-function tuning layer in the first trench and a thickness of the work-function tuning layer in the second trench is between about 12% to about 15%.

15. The method of claim 13, wherein a difference in a thickness of the work-function tuning layer in the first trench and a thickness of the work-function tuning layer in the second trench is between about 28% to about 39%.

16. A method for semiconductor processing, the method comprising:
forming a gate dielectric layer in a first trench and a second trench, the first trench and the second trench each being defined in a dielectric structure and intersecting a respective fin on a substrate;
forming a first metal layer over the gate dielectric layer in the first trench and the second trench;
removing the first metal layer in the second trench;
forming a second metal layer over the gate dielectric layer in the first trench and the second trench, wherein the first metal layer and the second metal layer are chemically different from each other;
removing the second metal layer in the first trench;
simultaneously forming a work-function tuning layer directly on the first metal layer in the first trench and the second metal layer in the second trench, wherein a growth rate of the work-function tuning layer on the first metal layer is different than a growth rate of the work-function tuning layer on the second metal layer, the work-function tuning layer having a different thickness on the first metal layer than the second metal layer; and
forming a first gate electrode over the work-function tuning layer in the first trench and forming a second gate electrode over the work-function tuning layer in the second trench.

17. The method of claim 16, wherein the work-function tuning layer comprises TiAlC, wherein a concentration of Al in the work-function tuning layer in the first trench is different than a concentration of Al in the work-function tuning layer in the second trench.

18. The method of claim 16, wherein the first gate electrode is a gate electrode of a first transistor of a first conductivity type, the second gate electrode is a gate electrode of a second transistor of the first conductivity type, wherein the first transistor and the second transistor have different threshold voltages.

19. The method of claim 16, wherein the first metal layer and the second metal layer have a substantially same thickness.

20. The method of claim 19, wherein the first metal layer and the second metal layer have a thickness in a range of about 8 Å to about 12 Å.

* * * * *